United States Patent [19]

Schmidt et al.

[11] Patent Number: 5,464,538
[45] Date of Patent: Nov. 7, 1995

[54] REVERSE OSMOSIS MEMBRANE

[75] Inventors: Donald L. Schmidt; Gene D. Rose; Edward E. Flagg, all of Midland, Mich.

[73] Assignee: The Dow Chemical Company, Midland, Mich.

[21] Appl. No.: 240,351

[22] Filed: May 10, 1994

Related U.S. Application Data

[62] Division of Ser. No. 920,029, Jul. 27, 1992, Pat. No. 5,310,581, which is a continuation of Ser. No. 459,085, Dec. 29, 1989, abandoned.

[51] Int. Cl.$^6$ .................................................. B01D 69/12
[52] U.S. Cl. ................ 210/490; 210/500.35; 210/500.42
[58] Field of Search ................................. 264/22, 41, 49; 210/490, 500.35, 500.42

[56] References Cited

U.S. PATENT DOCUMENTS

| | | |
|---|---|---|
| 3,189,457 | 6/1965 | Burness . |
| 3,320,141 | 5/1967 | Cisney et al. . |
| 3,335,100 | 8/1967 | Geyer . |
| 3,462,274 | 8/1969 | Maeder et al. . |
| 4,058,401 | 11/1977 | Crivello . |
| 4,069,054 | 1/1978 | Smith . |
| 4,069,055 | 1/1978 | Crivello . |
| 4,069,056 | 1/1978 | Crivello . |
| 4,081,276 | 3/1978 | Crivello . |
| 4,102,687 | 7/1978 | Crivello . |
| 4,108,747 | 8/1978 | Crivello . |
| 4,109,068 | 8/1978 | Graham . |
| 4,118,297 | 10/1978 | Broxterman et al. ................. 260/327 |
| 4,133,684 | 1/1979 | Tarumi . |
| 4,175,963 | 11/1979 | Crivello . |
| 4,229,519 | 10/1980 | Sharp et al. . |
| 4,250,203 | 2/1981 | Schlesinger et al. . |
| 4,338,232 | 7/1982 | Harris et al. ......................... 204/159 |
| 4,405,426 | 9/1983 | Hosoi et al. . |
| 4,423,136 | 12/1983 | Crivello et al. . |
| 4,431,782 | 2/1984 | Harris et al. . |
| 4,466,931 | 8/1984 | Tamsy . |
| 4,544,466 | 10/1985 | Lindstrom et al. . |
| 4,544,621 | 10/1985 | Roth . |
| 4,551,418 | 11/1985 | Hult et al. . |
| 4,564,580 | 1/1986 | Ichimura et al. . |
| 4,610,952 | 9/1986 | Crivello . |
| 4,632,891 | 12/1986 | Banks et al. . |
| 4,668,601 | 5/1987 | Kistner . |
| 4,704,324 | 11/1987 | Davis et al. . |
| 4,749,639 | 6/1988 | Frommeld . |
| 4,765,905 | 8/1988 | Kitamura et al. . |
| 4,797,187 | 1/1989 | Davis et al. . |
| 4,798,877 | 1/1989 | Hoffman et al. ........................... 522/6 |
| 4,839,203 | 6/1989 | Davis et al. . |
| 4,921,654 | 5/1990 | Hou et al. ........................... 264/48 X |
| 4,941,972 | 7/1990 | Kau et al. ........................... 210/490 |

FOREIGN PATENT DOCUMENTS

| | | |
|---|---|---|
| 34445 | 2/1983 | Japan . |
| 6604633 | 6/1966 | Netherlands . |

OTHER PUBLICATIONS

Farrington and Daniels, *Physical chemistry*, 1979, Ch. 11, p. 343.

Maycock and Berchtold, *Photochemical Reactions of Phenacyl– and Benzylsulfonium Salts*, J. Org. Chem., vol. 35, No. 8, 1970, pp. 2532–2538.

B. Arnold et al., Homolytic versus heterolytic cleavage for the photochemistry of 1–naphthylmethyl derivatives. Feb. 28, 1985, pp. 3140–3146.

B. Foster et al, Substituent effects on homolytic versus heterolytic cleavage of (1–naphthylmethyl) trimethylammonium chlorides. Oct. 10, 1986. pp. 1599–1607.

K. Inomata et al, "Synthesis of Multifunctional Polymeric Photosensitizers Containing Pendant Benzopehnone Radical and Various Quaternary Salt Structure and the Photchemical Reaction Using These Polymers", J. Chem. Soc., Japan, 1989 (7) pp. 1129–1134.

M. Ko et al, "Photopolymerization of Vinyl Monomers with Quaternary Ammonium Salts", J. Poly. Sci: Polymer Chemistry Edition, vol. 12, pp. 2943–2951 (1974).

Lloyd D. Taylor et al, "The Phtochemical Rearrangement of Polymeric N–(1–Pyridinio) Amidates. A Novel, Aqueous Photresist System", J. Poly. Sci: Part Polymer Letters, vol. 26, pp. 177–180 (1988).

G. D. Jones et al., "Water–Soluble Photocurable Elastomer", Journal of Applied Polymer Science, vol. 23, pp. 115–122 (1979).

M. A. Ratcliff, Jr. et al., "Solvolytic and Radical Processes in the Photolysis of Benzylammonium Salts", Journal of Organic Chemisty, vol. 36, No. 21, pp. 3112–3120 (1971).

A. Kunieda et al., "Free–Radical Polymerizaton by Sulfonium Salt", Polymer Letters Edition, vol. 12, pp. 395–397 (1974).

Abstract, J1–C3 Semi–permeable sepn, 1274F, 46029, Japanese Kokai J6 1249–502A, Publication No. JP 090661 (Jun. 11, 1986).

Minoru Kumakura et al., "Properties of Membranes Obtained by Radiation Cast Polymerizaton of Hydroxyalkyl Methacrylate Monomers", J. Membrane Sci., 17 (1984) pp. 71–77.

D. L. Schmidt, "Polymerization of Aryl Cyclic Sulfonium Switterions", reprint from ACS Symposium Series, No. 59, Ring–Opening Polymerization (1977).

D. L. Schmidt et al., "Water–Based Coatings From Aryl Cyclic Sulfonium Zwitterion (ACSZ) Monomers", reprint from Jan. 1974 issue of the Journal of Paint Technology, vol. 46; No. 588, pp. 41–46.

J. F. King et al., "Nucleophilic Substitution Factors. 1. Coplanar vs. Orthogonal Bimolecular Substitution at a Benzylic Carbon. X–ray Structure of 2–Isobutyl–1, (List continued on next page.)

*Primary Examiner*—Frank Spear

[57] ABSTRACT

Novel reverse osmosis membranes and a method for preparing such membranes are described. A substrate can be coated with a first compound bearing a plurality of onium groups and a second compound bearing a plurality of nucleophilic groups. The resulting coating cures readily upon exposure to actinic radiation.

11 Claims, No Drawings

OTHER PUBLICATIONS

3–dihydrobenso[c]thiophenium Perchlorate", J. Am. Chem. Soc. 1985, 107, pp. 3224–3232.

Melvin J. Hatch et al., "Sulfonium Polymers Derived from Ar–Vinylbenzyl Chloride. I. Exploratory Study of the Preparation and Properties of the Monomers and Polymers", J. Applied Polymer Science, vol. 13, pp. 721–744 (1969).

Franklin D. Saeva et al., "Mechanism of One–Electron Electrochemical Reductive Cleavage Reactions of Sulfonium Salts", J. Am. Chem. Soc., (1984), 106, pp. 4121–4125.

J. V. Crivello, "Cationic Polymerization—Iodonium and Sulfonium Salt Photoinitiators", Advances in Polymer Science 62, (1984) pp. 1–48.

S. Peter Pappas et al., "Photoinitiated Cationic Polymerization by Photosensitization of Onium Salts", (1979) Soc. of Photographic Scientists and Engineers pp. 140–143.

James V. Crivello et al., "Rencent Advances in Thermally and Photochemically Initiated Cationic Polymerization", Polymer Journal, vol. 17, No. 1, (1985) pp. 73–78.

J. V. Crivello, "Recent Progress in the Design of New Photoinitiators for Cationic Polymerization", Cationic Polymerization and Related Processes ISBN 0.12.287470.6 (1984) pp. 289–305.

F. Volatron et al., "Theoretical Study of the Reactivity of Phosphonium and Sulfonium Ylides with Carbonyl Groups", J. Am. Chem. Soc., (1984) 106, pp. 6117–6119.

J. D. Coyle, "Photochemistry of Sulphonium Compounds", The Chemistry of the Sulfonium Group Edited by C. J. M. Stirling and S. Patai (1981) Chapter 5, pp. 107–122.

Takayuki Otsu et al., "Polymerization of Methyl Methacrylate with Dimethylbenzylanilinium Chloride", J. Polymer Sci., Part A–1, vol. 7 (1969) pp. 3329–3336.

S. Peter Pappas, "UV Curing by Radical, Cationic and Concurrent Radical–Cationic Polymerization", Radiat. Phys. Chem., vol. 25, Nos. 4–6, (1985) pp. 633–641.

E. Reichmanis et al., "Polymer Materials for Microlithography", Ann. Rev. Mater. Sci. (1987), 17, pp. 235–271.

S. K. Chadda et al., "Novel Thin–Film Composite Membranes Containing Photoreactive Groups Part I: Choosing the Photoreactive Group", Synopsis, Dept. of Chemistry, Dept. of Chemical Engineering, McMaster Univ., Hamilton, Ontario, Canada, pp. 1–23, Table 1–7, two pages of figures.

Howard E. Zimmerman et al., "Mechanistic Organic Photochemistry. II. Solvolytic Photochemical Reactions", Organic and Biological Chemistry, vol. 85, Apr. 5, 1963, pp. 915–922.

Cheng–I Lin et al., "Charge–Transfer–Induced Photosolvolysis of Benzyl Alcohols" Communications to the Editor, J. Am. Chem. Soc., 98:21, Oct. 13, 1976 pp. 6711–6713.

Cheng–I Lin et al., "Wavelength Dependent Carbonium Ion Fromation by Photosolvolysis of Benzoates", Communications to the Editor, J. Am. Chem. Soc., 98:24, Nov. 24, 1976, pp. 7848–7850.

C. G. Roffey, "Photopolymerization of Surface Coatings", a Wiley–Interscience Publication, pp. 287–296 and 301–304 (1982).

REVERSE OSMOSIS MEMBRANE

CROSS REFERENCE TO RELATED APPLICATION

This application is a divisional of application Ser. No. 07/920,029 filed Jul. 27, 1992, now U.S. Pat. No. 5,310,581, which is a continuation of Ser. No. 07/459,085 filed Dec. 29, 1989, now abandoned, and is related to application Ser. No. 08/110,605 filed Aug. 23, 1993.

BACKGROUND OF THE INVENTION

The present invention relates to a photocurable composition, which is suitable for making photoresists, composite permselective membranes, and novel coatings.

A wide variety of photocurable compositions and photoreactive materials are known in the prior art. Two main approaches exist in the art for producing photocurable compositions: (1) photocurable (photoinduced radical) compositions based upon polymerizable ethylenically unsaturated groups, and (2) photocurable compositions based upon photoacid generating compounds which function as photoinitiators for cationic polymerization. Both these approaches are reviewed in *UV Curing; Science and Technology*, S. P. Pappas, Editor, Technology Marketing Corporation, Norwalk, Conn. (1980). Illustrative ethylenically unsaturated compositions are described in U.S. Pat. Nos. 4,544,621; 4,564,580, 4,668,601, and 4,798,877. In one embodiment these photocurable compositions can comprise a photoinitiator, such as the onium compounds described in U.S. Pat. No. 4,632,891, and a polymerizable material which is activated by the photoinitiator. U.S. Pat. No. 4,229,519 discloses that polymers containing quaternary nitrogen groups bearing ethylenically unsaturated groups may be cured with radiation under nitrogen in the presence of a suitable photoinitiator.

Illustrative of photocurable compositions which comprise a photoacid generating initiator are those described in U.S. Pat. Nos. 4,081,276; 4,551,418 and 4,610,952. The most common photoacid generating systems are diaryliodonium and triarylsulfonium salts. Recent work in photoacid generating compounds are described in proceedings of ACS Division of Polymeric Materials, Science and Engineering, Vol. 61, Fall Meeting 1989, in Miami Beach, Fla. J. V. Crivello, "Chemistry of Photoacid Generating Compound", p. 62. Generally, these photocurable compositions are water incompatible and require organic solvents for preparation of coatings.

U.S. Pat. No. 4,118,297 describes aromatic cyclic sulfonium zwitterions which polymerize upon exposure to ultraviolet light. Japanese Kokai No. 34,445, published Feb. 28, 1983 describes photosensitive zwitterions of aryl cyclic sulfonium.

In conventional processes a photocurable composition is selectively exposed to actinic or other radiation in a desired pattern. The portions of the composition which are not subjected to radiation can be removed or developed by immersion in a suitable solvent. This is commonly referred to as a negative photoresist. In some applications, a photocurable composition is rendered more soluble by exposure to radiation and this photoreacted area is removed during developing. Such compositions are referred to as positive photoresists.

Photocurable compositions are commonly used to form lithographic printing plates, inks cured with ultraviolet (UV) radiation or printed circuits. After development of the image on the desired substrate, the exposed surface may be etched by conventional techniques. Similar techniques can be used to manufacture integrated circuits and other microelectronic components. However, photoresists used in such applications must afford a very high degree of resolution because of the fine detail required in these miniaturized images.

For accurate image formation in microlithographic applications it is desirable to have a relatively thin coating (typically about 0.4 to 1.2 micrometers) of the photosensitive composition material. Further, it is desirable that the composition photocure relatively rapidly. The need for thin coatings of a photo-sensitive composition is related to the limited depth of focus of typical exposure patterning equipment and to the minimization of light scatter from the film deposited. The diffusing and spreading effect of the diffraction pattern of the exposing actinic radiation can limit the resolution of fine detail of the photoresist pattern. The very short wavelength of the exposing wavelength of this resist will (proportionately) decrease the width of the diffraction pattern and increase the resolution of fine detail of the resist pattern. In addition, the coating on the surface should be substantially free from pinholes and other blemishes, which would result in defects in the image produced.

Another field in which coatings having very few defects or irregularities are desired is in the field of permselective composite membranes. These are composite membranes which are used for selective separation of components in gases or liquids. Illustrative reverse osmosis membranes are described in U.S. Pat. No. 4,277,344. U.S. Pat. No. 4,704, 324 describes preparation of membranes by reaction of onium compounds with nucleophilic compounds and is incorporated herein by reference.

New and improved photocurable coatings suitable for photoresist or membrane applications are desirable. Coatings which cure rapidly with few defects using deep UV radiation and which can be applied from an aqueous solution would be advantageous. These coatings can be used with conventional etchings for manufacture of electronic components and also in membrane applications where chemical stability is of particular importance.

Adhesives are used to bond together organic polymeric components in automobiles and electronic devices. To attain the desired adhesion, polymer surfaces often need to be modified by methods such as chemical etching, electron bombardment and corona discharge. These methods often utilize treatment with chemicals, which may present environmental hazards, produce toxic gases and are inconvenient and expensive. A new and improved method of modifying polymer surfaces is desired.

Fluorocarbon polymers are used in applications that require anti-soiling and oily soil release such as fabrics and cooking utensils. There is a need for a means of applying a photocured or crosslinked fluorocarbon coating to surfaces.

SUMMARY OF THE INVENTION

The present invention relates to water or polar solvent-soluble, photocurable adherent coating compositions. These compositions may be useful for preparing photoresists, composite permselective membranes and modifying surfaces either for accepting adhesives or releasing oily soil. In this method, a first compound bearing at least one photolabile onium salt group linked to a chromophore, said onium salt having a compatible anion and optionally a second compound bearing at least one photo-reactive nucleophile is applied to a substrate in an intimate mixture. A photo-reactive nucleophile is a group capable of forming a covalent bond by a photoinduced reaction with the photolabile onium moiety. The photolabile onium group is a cationic group selected from

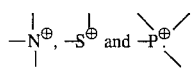

A compatible anion is one preferably which does not interfere with the desired reaction by which the composition is photocured. Certain preferred compatible anions may participate in the reaction or facilitate the reaction. The term "chromophore" is used herein to refer to a group which by absorption of electromagnetic radiation activates the onium group to displacement by a photo-reactive nucleophile, reaction with the compatible anion or some other reaction by which the composition is cured. The "linking group" is a divalent moiety joining the chromophore and onium moiety in a manner which renders the onium photolabile. The "photolabile onium" substituent is advantageously free of other photopolymerizable moieties, such as ethylenically unsaturated groups, which are susceptible to reaction when exposed to electromagnetic radiation. In a preferred embodiment, a coating of the first and second compounds is then exposed to radiation effective to react at least one photolabile onium group on the first compound with a photo-reactive nucleophile on the second compound with extinction of the cationic charge of the onium group reacted. The nucleophile may be photolabile, but is not necessarily photolabile if the photolabile onium group is sufficiently reactive.

In another aspect, this invention relates to photocured compositions made by reaction, upon exposure to electromagnetic radiation, of a first compound bearing a plurality of photolabile onium salt groups linked via a linking group to a chromophore with a compatible anion or a second compound bearing a plurality of photo-reactive nucleophiles. Such compositions can be used to manufacture protective or discriminating layers for reverse osmosis membranes or gas separation membranes, to make photoresists or to form coatings on a variety of substrates. In one preferred embodiment, this method can be used to prepare fluorocarbon coatings like those described in U.S. patent application Ser. No. 402,176, filed Sep. 1, 1989, the teachings of which are incorporated herein by reference. Because the photocured coatings need not be exposed to high temperatures, a thin coating may be applied to a thermally-unstable substrate. The resulting thin coating may serve as a primer for adhesives or paints and may render the substrate less sensitive to solvents.

The properties of the photocured coatings are different than those produced by thermal curing. Generally, photocured coatings exhibit better adhesion to polymer surfaces than the identical thermal cured compositions. Photocured coatings on membranes typically show higher flux than thermally cured compositions. Certain compositions which contain regions that have been photocured to render them water-insoluble and other regions which have not been cured are also believed novel.

DETAILED DESCRIPTION OF THE INVENTION

The onium groups in the first compound referred to herein are known in the art, although their photolabile properties were not previously recognized. Known onium groups include aryl cationic moieties, which have been described as photoacid generating initiators in the prior art. For example, *The Chemistry of the Sulfonium Group*, edited by C. J. M. Stirling and S. Patai, pp. 107–122, John Wiley & Sons (1981), describes the photochemistry of sulfonium compounds. *Advances in Polymer Science,* 62, pp. 1–48, Springer-Verlag Berlin, Heidleberg (1984), describes the cationic polymerization using iodonium or sulfonium salt photoinitiators. In general, while the use of certain onium compounds as acid producing photoinitiators is known, it has not been reported in the prior art that compounds or polymers bearing a plurality of onium groups bonded to a chromophore through a linking group react readily with photo-reactive nucleophile compounds when irradiated. It has been found that in preferred embodiments, the compound or polymer bearing a plurality of photolabile onium groups will react at ambient temperatures with even weakly photo-reactive nucleophile groups, such as amides, urea moieties or sulfonic acid salts.

Preferred photolabile onium groups include sulfonium, quaternary ammonium, phosphonium, pyridinium, thiazolinium, imidazolinium or azetidinium groups. Diazonium groups are not onium groups as the term is used herein. Techniques and processes for making compounds bearing the desired moieties are well known in the prior art. U.S. Pat. Nos. 2,676,166; 2,891,025; 3,269,991; 3,329,560; 3,429,839; 3,544,499; 3,636,052; 3,723,386; 3,962,165; 4,002,586; 3,804,797; 4,337,185; 4,483,073; 4,426,489; 4,444,977 and 4,477,640 are incorporated herein by reference to illustrate techniques for making such compounds. Especially preferred as photolabile oniums are those containing a sulfonium, quaternary ammonium or phosphonium group. Preferably, the substituents on the photolabile onium group are each independently hydroxyalkyl, phenyl or alkyl groups or are heterocyclic saturated moieties which include the onium in the ring. Most preferably, the photolabile onium group is bonded to the —(CH$_2$—)— moiety of a benzyl group and is a dialkyl sulfonium, trialkyl phosphonium or trialkyl ammonium moiety wherein each alkyl has from about 1 to about 16 carbon atoms or is a sulfonium, alkyl phosphonium or alkyl ammonium where two of the valences are part of a five- or six-member ring including the onium. It is preferred that the total number of carbon atoms present in the alkyl, phenyl and hydroxyalkyl substituents on the onium moiety (not including the chromophore or linking group) is less than 20.

The chromophore group is preferably an aromatic group. The chromophore group must be joined to the onium moiety by a linking group advantageously selected from methylene, i.e., (—CH$_2$—), ethylidene (i.e.,

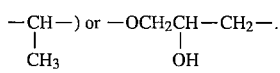

If the linking group is not present, the onium group is generally not photolabile. Especially preferred as a chromophore is a phenyl or naphthyl group which is pendant from a polymer backbone. Especially preferred as a linking group is methylene or $$-OCH_2\overset{\overset{\displaystyle OH}{|}}{C}HCH_2-.$$

Preferably, the compound bearing the benzyl onium salt groups is a vinyl addition polymer. Such polymers can readily be prepared by conventional vinyl addition polymerization of vinyl benzyl chloride with other compatible monomers followed by reaction of the benzyl chloride with a suitable onium precursor. For example, dialkyl sulfide will react with the benzyl chloride group pendant from a vinyl addition polymer to form a dialkyl sulfonium group. Tertiary amines or $PR_3$ compounds, wherein R at each occurrence is independently alkyl, phenyl or hydroxalkyl, will react with benzyl chloride in a similar manner. Alternatively, a polystyrene or styrene copolymer can be chloromethylated via conventional techniques to introduce benzyl chloride groups. The benzyl chloride groups can then the converted to onium groups as described hereinbefore for the vinyl benzyl chloride polymers.

The anion associated with the photolabile onium group is advantageously selected so as to promote reaction between the photolabile onium group and the photo-reactive nucleophile species present on the second compound, when exposed to radiation. Any anion is operable so long as the reaction is not deleteriously affected. Preferred anions include trifluoroacetate, bicarbonate and mercaptide. Phenyl phosphinate, benzyl phosphonate or citrate anions are suitable anions. Hydroxide and chloride anions are generally not as advantageous as the preferred anions, but are generally suitable when the onium is phosphonium or ammonium. Optionally, inner salts or partial inner salts of onium compounds can be employed, such as a polymer bearing both carboxylate and photolabile onium groups. In general, it is preferred that the anion be a relatively strong conventional nucleophile or strong base. Some anions, such as hydroxide, in some embodiments will also make a sulfonium or certain other onium groups more susceptible to the competing thermal reaction or degradation. The counterion can be readily changed by contacting the compound bearing onium group with an appropriate ion exchange resin in the conventional manner to effect conversion to the desired anion. For some end uses specific counterions are preferred. For example, bicarbonate is generally the preferred counterion for a photoresist.

The second compound bearing a plurality of photo-reactive nucleophile groups can be one generally known in the prior art. Depending on the reactivity of the specific photolabile onium group, the photoreactivity of the photo-reactive nucleophile on the second compound may vary over quite a wide range. Illustrative photo-reactive nucleophiles include amide, sulfide, sulfonamide, phosphate, phosphonate, phosphinate, bicarbonate or halide. Preferred photo-reactive nucleophiles include caroxylate, alkoxide or phenoxide groups. These groups may also be in their conjugate acid forms, i.e., carboxylic acid, alkanol or phenol, but the deprotonated group is more reactive. Advantageously, the photo-reactive nucleophile contains a hydrophobic moiety for photoresist applications. Particularly preferred as photonucleophiles are carboxylate groups. In one preferred embodiment of the invention, the photo-reactive nucleophile will be a polymer derived by vinyl addition polymerization of unsaturated moieties bearing nucleophilic groups reactive with photolabile onium groups. For example, methacrylic acid, acrylamide or hydroxyethyl methacrylate can be employed as photo-reactive nucleophilic monomeric groups which can be reacted in a conventional vinyl additional polymerization to produce a polymer useful as a second compound described herein. A plurality of carboxylic acid groups are advantageously present as carboxylates. The pH of the aqueous medium should be maintained so carboxylates are present and so that the desired solubility is attained.

The present invention involves a photolabile onium moiety, $Q^{\oplus}$, which is rendered photolabile by being connected through a linking group, Z, to an aromatic chromophore ArC. The photo-reactive nucleophile is represented by PNu and is an electron donor. Upon photolysis, the onium moiety, $Q^{\oplus}$, undergoes a photoassisted reaction with an electron donor group to yield a covalent bond joining the residue of the photo-reactive nucleophile, PNu', to the linking group. Q' is the residue of the photolabile onium. The photo-reactive nucleophile may be anionic or may be anionic after abstraction of a proton. The general reaction believed to occur during photocuring can be represented by:

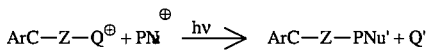

Other photochemical processes may also occur, such as reactions of radicals.

A preferred class of photoreactive systems is represented by Formula I

where illustrative embodiments of ArC, Z, $Q^{\oplus}$ and $PNu^{\ominus}$ are presented in Table A.

TABLE A

| ArC | Z | $Q^{\oplus}$ | PNu | | | | |
|---|---|---|---|---|---|---|---|
| ![phenyl-R'] | $-CH_2-$ | $-\overset{\oplus}{S}\begin{smallmatrix}R_1\\R_2\end{smallmatrix}$ | $Cl^{\ominus}$ | $OH^{\ominus}$ | $^{\ominus}OR$ | $CO_3^{\ominus}$ | $HCO_3^{\ominus}$ |
| ![R'-phenyl-O-phenyl-R'] | | $-\overset{\oplus}{\underset{R_2}{N}}\begin{smallmatrix}R_1\\R_2\end{smallmatrix}$ | $R-C\overset{\displaystyle /\!\!/O}{\underset{\displaystyle O^{\ominus}}{\diagdown}}$ | $R_F-C\overset{\displaystyle /\!\!/O}{\underset{\displaystyle O^{\ominus}}{\diagdown}}$ | $R_1R_2N-\overset{\overset{\displaystyle O}{\|}}{C}-N-R_2H$ | | |

TABLE A-continued

| ArC | Z | Q⊕ | PNu |
|---|---|---|---|
| 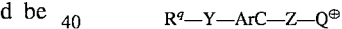 (diaryl sulfide with R') | —O—CH2—CH(OH)—CH2— | $-\overset{\oplus}{\underset{R_2}{\overset{R_1}{P}}}-R_2$ | $\overset{O}{\underset{\ominus O}{\overset{\diagdown}{C}}}(CH_2)_n\overset{O}{\underset{O^\ominus}{\overset{\diagup}{C}}}$ ; $R_FO^\ominus$ ; $\overset{O}{\underset{}{\overset{\|}{R}CNR_2H}}$ |
| (diaryl sulfoxide with R') | | $-S\oplus$ (cyclic) | $H_2PO_4^\ominus$ ; $R-\overset{O}{\underset{OH}{\overset{\diagup}{P}}}-O^\ominus$ ; $\overset{R}{\underset{R}{\overset{\diagdown}{P}}}\overset{O}{\underset{O^\ominus}{\overset{\diagup}{}}}$ |
| (naphthalene with R') | | $-N\oplus$ (pyridinium) | $R-O-\overset{O}{\underset{OH}{\overset{\diagup}{P}}}-O^\ominus$ ; $R'$—phenoxide $O^\ominus$ |
| (biphenyl/methylene bridged with R') | | $-N\oplus$ (cyclic) | $R-\overset{O}{\underset{O}{\overset{\diagup}{S}}}-NH^\ominus$ ; succinimide $N^\ominus$ ; $R-C\overset{O}{\underset{O^\ominus}{\overset{\diagup}{}}}$ | where in Table A each moiety at each occurrence is independently selected from the group consisting of R'=hydrogen, alkyl $C_1$-$C_{18}$, —Cl, —$NO_2$, —COOH, —O($C_1$ to $C_{18}$ alkyl), a polymer or copolymer backbone optionally inertly substituted or bears a plurality of $Q^\oplus$ and/or $PNu^\ominus$;

$R_1$ and $R_2$ are each independently hydrogen $C_1$-$C_{18}$ alkyl, or —$CH_2(CH_2)_u$OH, preferably $CH_3$ or tertiary-butyl, where u=1 to 12;

$R_F$ is a fluorinated alkyl.

$R_F$ may be an alkyl which is not fully fluorinated, but no more than one atom of hydrogen or chlorine should be present in place of fluorine for each carbon atom.

$R_F$ is preferably —$(CF_2)_vCF_3$, where v is an integer from 1 to 12, more preferably from 6 to 12, or $R_F$ is preferably —$(CH_2)_x$—$(CF_2)F$, where x is an integer 1 or 2 and y is an integer from 1 to 12, more preferably from 6 to 12; and R=$C_1$ to $C_{18}$ alkyl, phenyl or a polymer or copolymer which is optionally inertly substituted or bears a plurality of $Q^\oplus$ and/or $PNu^\ominus$.

The photoreactive moiety, ArC—Z—$Q^\oplus$, may be used as a low molecular species, for example

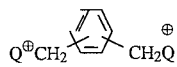

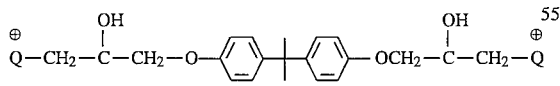

The photoreactive moiety may also be attached to a polymer, either as a pendant group or as an end group. For example, a class of polymers can be represented by Formula II:

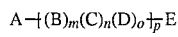     (II)

A and E are each terminal groups resulting from a vinyl polymerization, and B, C and D are internal covalently bonded groups which can be arranged in any sequence. The subscripts m, n and o represent molar ratios and m+n+o= 1.00 where m is in the range from about 0.03 to about 1.00, n is in the range from 0 to 0.97 and o is in the range from 0 to 0.96. The subscript p is the average degree of polymerization, preferably from about 2 to 1,000, more preferably from about 100 to about 1000.

In Formula II, B is a photoreactive moiety which has the formula $R^q$—Y—ArC—Z—$Q^\oplus$ wherein $R^q$ is a group which includes a carbon-carbon single bond formed during vinyl addition polymerization of the polymer and Y is a chemical bond or a noninterfering, bivalent moiety. ArC is a chromophore, Z is a linking group and $Q^\oplus$ a photolabile onium as defined hereinbefore. Preferably $R^q$ is the residue of an ethylenically unsaturated monomer, more preferably —[$CH_2$—CH]— or

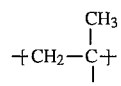

and Y is a chemical bond (in which case B is $R^q$—ArC—Z—$Q^\oplus$) or a noninterfering connecting group, such as

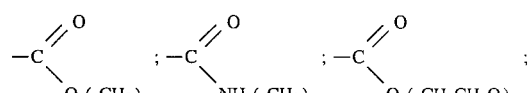

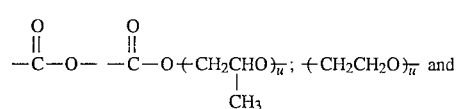

-continued

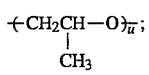

wherein u is independently at each occurrence an integer from 1 to 20 and v is an integer from 1 to 12, but preferably 1. Illustrative examples of B include

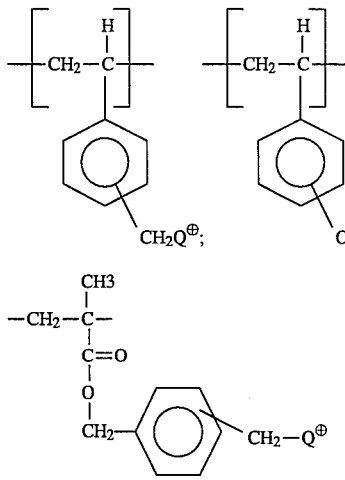

In Formula II, "C" is a group derived from an ethylenically unsaturated monomer which has the formula:

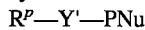

where $R^p$ is a residue of an ethylenically unsaturated monomer, PNu (as defined hereinbefore), and Y' is a chemical bond, in which case "C" is $R^p$—PNu, or Y' is a noninterfering group, such as —C(O)—(CH$_2$)$_u$ or —C(O)O(CH$_2$)$_u$ wherein u is an integer from 1 to 20. Illustrative of "C" are

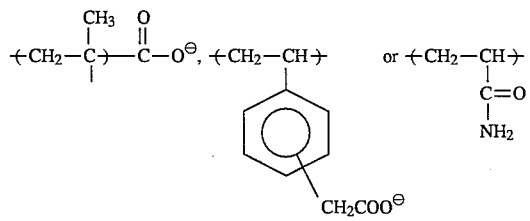

In Formula IID has the formula

where $R^h$ is an organic group and the residue from a polymerized ethylenically unsaturated monomer, more preferably

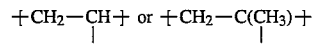

and G is an organic noninterfering group, such as

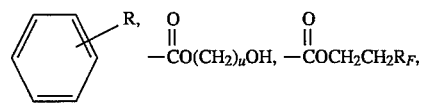

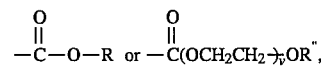

wherein R is as previously defined for Table A, $R_F$ is as previously defined for Table A, R" is a $C_1$ to $C_{18}$ alkyl or aralkyl, and u is an integer from 1 to 20 and v is an integer from 1 to 40.

A and E in Formula II are each independently end groups consistent with vinyl addition polymerization. Illustrative end groups are $CH_3(CH_2)S$—, H—, $CH_3^-$, $(CH_3)_3CO$—, Cl— and —OH.

In another embodiment of the subject invention, the first and second compounds can be prepared in situ from polymerizable moieties bearing at least one nucleophilic or onium group. For example, vinylbenzyl chloride, methylmethacrylate and methacrylic acid can be copolymerized using a free radical initiator and reacted in situ with trimethylamine to yield a water miscible polymer useful as a photoresist for microlithography. Advantageously, the chloride salt would be converted to the bicarbonate salt via ion exchange prior to use as a photoresist.

In general, after the polymers bearing onium groups or nucleophilic groups are prepared it is desirable to separate the oligomers so that only higher molecular weight polymers are used as the first and second compounds. Oligomers can be conveniently separated by use of conventional dialysis techniques or ultrafiltration membranes.

The polymers bearing onium and/or nucleophilic groups can optionally be derived from unsaturated moieties bearing other compatible groups. In some instances it may be desirable to use such compatible monomers in order to enhance certain properties of the resulting compounds, such as their hydrophobic or hydrophilic properties, their film-forming properties or glass transition temperature. For example, nonylphenoxy polyoxyethylene (10) methacrylate (9N10MA) or other surface active monomers can be used to render the polymer more wettable. Other compatible monomers include a $C_1$ to $C_{12}$ alkyl methacrylate or hydroxyethyl methacrylate. Preferably, the first and second compounds display a good combination of properties. For example, it is desirable that said compound is soluble or dispersible in aqueous media. At the same time the compound should be sufficiently wettable such that it can readily be deposited on the substrate on which the compounds are to be reacted.

The first and second compounds can be conveniently applied to a substrate by conventional coating techniques. Conveniently, a diluent is used in which the first and second compounds are soluble or readily dispersible and which does not adversely affect the first and second compounds or the substrate. Conveniently, water or an aqueous diluent is employed. Small amounts of surfactants can be used as necessary to improve the uniformity of the coating. Other adjuvants, including viscosity modifiers, polymerization inhibitors, coupling agents (which promote adhesion of the coating to the substrate) and pigments, may also be present. In general, photoinitiators are not essential. It is also typically not essential to exclude oxygen from the coating. The coating can be applied to a substrate by conventional techniques such as dipping, spin coating, casting, spraying, wiping, rolling or filtration of the coating solution through a porous substrate. Excess coating can be conveniently removed by draining or by drawing a smooth instrument, such as a blade or roller, across the substrate. Optionally, multiple applications of the first and second compound in a single or different diluent can be used.

Suitable supports for the coating include metal, plastic, glass, semiconducting materials (such as silicon), paper and porous supports conventionally used for composite membranes, such as polysulfone. The coating may be continuous or discontinuous, e.g., in a pattern.

Where the first and second compounds are applied in a solution or with a diluent the coating is advantageously dried prior to exposure to radiation. In some embodiments of the invention, the first and second compounds may be reacted in a diluent or in a gel by irradiation. Generally, it is desirable that these compounds be irradiated when substantially dry. It is believed operable but not preferred to apply the first and second compounds in an intimate admixture which is dry, for example by powder coating.

The concentration of the first and second compounds in the diluent in which they are applied are not generally critical so long as the reactive species are in an effective concentration when they are irradiated such that the desired reaction will occur readily. Conveniently, the concentration of the reactants in the coating solution is in the range from about 0.01 to about 60 weight percent, preferably 1.0 to about 25 weight percent. Preferred concentrations would be dependent in part on the molecular weight of reactive species, the coating thickness desired and other factors.

The temperature of the coating is advantageously maintained so as to avoid premature thermally-induced reactions. Preferably, the temperature is generally maintained in the range from about zero degrees to about 80° C., more preferably about 10° to about 35° C. Some less thermally reactive oniums, such as quaternary ammonium, are thermally stable and can be used at higher temperatures. The maximum temperature to which these coatings can be subjected depends upon the photolabile onium, humidity and other factors. A copolymer bearing vinylbenzyltrimethylammonium bicarbonate can be heated at reduced pressure at 40° C. for 5 hours with almost no reaction. However, a similar vinylbenzyldimethylsulfonium bicarbonate will cure sufficiently at 25° C. and 40 percent relative humidity that after 5 hours it is not readily removed by a water rinse.

The pH of the coating may be controlled as necessary to maintain certain groups or anions in the desired state. For example, it may be desired to maintain a neutral or slightly basic pH so as to have carboxylate groups present.

The coatings after application can be readily dried at room temperature, optionally using reduced pressure. Alternatively, a slightly elevated temperature may be employed. Desirably, the coatings are not subjected to significant radiation prior to desired curing. The coatings generally are more thermally stable in the wet state than when dry. Some coatings, such as those based on quaternary ammonium, may need to be substantially dry to satisfactorily photocure.

The subject photoreactive compositions are activated by treatment with electromagnetic radiation of suitable wavelengths. The wavelength of radiation most effective will depend upon the specific compounds to be cured. In general, electromagnetic radiation having a wave length in the range from about 200 to about 300 nanometers is operable to effect reaction of compositions bearing benzyl onium groups. Especially preferred is ultraviolet radiation having a wavelength in the range from about 220 to about 260 nanometers. The intensity of radiation required will depend upon the specific compounds, the wavelength of radiation, the time of exposure and other factors. In general an intensity of about 1 to 10 milliwatts per square centimeter is convenient, but the intensity may need to be adjusted for specific conditions. Photosensitizers, may be present in the photoreactive composition to modify the wavelengths and intensity at which the composition will cure, but are not necessary for most applications.

The variety of conventional electromagnetic radiation sources can be employed to react the compositions described herein. For example, ultraviolet lamps such a metallic halide, metallic arc, pulse or flash ultraviolet, mercury-xenon, or mercury vapor discharge lamps can be employed. Excimer lasers or tunable lasers producing radiation in the desired wavelengths may also be employed.

The method by which the subject compositions react in the presence of radiation is not fully understood. It is believed that the irradiation of the subject compositions may activate nucleophilic displacement of certain susceptible onium groups. With the guidance provided in this specification, one of ordinary skill in the art will be able to envision a number of potentially reactive first and second compounds and specific methods and utilities for such compositions within the scope of the subject invention.

The subject compositions and method can be used to cure a number of coatings or compositions having myriad utilities. For example, certain of these compositions can be used to produce a negative photoresist. These compositions are particularly useful because the polymers prior to reaction may be water-soluble. The compositions when photocured are generally rendered water-insoluble. Accordingly, it is possible to use water as a developer for such compositions. It has been observed in preferred embodiments of the subject invention that resolutions of 0.75 microns or less can be obtained for the subject compositions. Accordingly, these photo-reactive compositions can be used to produce a photoresist having a very high degree of resolution. Particularly, preferred photoresist compositions include terpolymers of methacrylic acid (MAA), methyl methacrylate (MMA) and vinylbenzyl trimethylammonium salts (VBTMA), wherein the mole ratio of MAA and VBTMA is approximately equal and each represents from about 5 to about 30 mole percent of the polymer.

It is also possible to modify the subject photoreactive compositions so as to produce positive photoresist. By photolysis the solubility of a photolabile onium functional polymer with hydrophobic anions may be change from soluble in a polar solvent, such as water, to soluble in a nonpolar solvent, such as heptane, hexane or methylene chloride. Before photolysis, the ion pairs impart polarity but after photolysis and the accompanying loss of charge, the polymer becomes non-polar. In a similar manner, an anionic functional polymer (such as a carboxylate) with hydrophobic photolabile onium counterions may be rendered hydrophobic by photolysis. It is thereby possible to develop this system with a non-polar organic solvent. This modification of these photoreactive compositions produce positive photoresists.

Clear differences exist between the photochemistry of polyonium salts and typical, unsaturated photosensitive polymers described in the prior art. No initiators are needed for the polyonium salts described herein and the wavelength range is restricted. Polyonium photochemistry described here does not require photoacid generated intermediates. The polyonium salts can be used for sensitive, high-resolution negative or positive photoresists. Similar salts are being used to make high flux, high rejection membranes. Photochemical curing is preferred to thermal curing in most cases.

In certain preferred embodiments, the subject compositions can be deposited on polysilicon wafers and photocured. It has been found that these compositions show resistance to carbon tetrafluoride plasma etch equivalent or superior to certain commercial photoresist. Accordingly, it is possible to etch silicon substrates to a considerable depth without loss of resolution. This is particularly desirable in the manufacture of certain solid state electronic devices.

Another utility for the subject photocured compositions is in the preparation of permselective membranes or coatings for such membranes. The photo-induced reaction of vinyl benzyl onium group with a photo-reactive nucleophile species can be used to crosslink a variety of polymers known to have utility as discriminating layers in gas separation and reverse osmosis membranes. One advantage of these compositions is that an aqueous coating formulation can be used. These compositions in many instances may be generally similar to those thermally cured compositions in U.S. Pat. No. 4,704,324. It is believed that the photocured reaction of such compositions is not necessarily identical to the compositions obtained by thermal curing. Moreover, the photocure proceeds much more quickly and can be used to make very thin layers which are more asymmetric than those obtained by thermal curing. The depth of curing is more easily controlled in photocured compositions than in thermal cured compositions. This is particularly advantageous in formation of a thin discriminating layer on a porous support in preparation of composite membranes. Thermal methods of curing are generally not suitable for the initial imaging to create the fine resolution required in photoresists for electronic applications. The compositions used as membrane coatings or discriminating layers can be cured on appropriate substrates. For example, microporous polysulfone can be used as a substrate. The cure can proceed in discrete regions of the membrane or can proceed continuously.

Another utility for the subject compositions is in the preparation of various coatings. For example, precursors of fluorocarbon coatings described in U.S. patent application Ser. No. 402,176, filed Sep. 1, 1989, can incorporate benzyl onium groups and nucleophilic groups as described herein. These compositions can then readily be photocured to produce coatings which are very durable. In another preferred embodiment of this invention fluorinated alkoxides can be reacted with a polyfunctional photolabile onium polymer to form a fluorinated ether polymer, which is a water resistant film.

One skilled in the art will appreciate that the the subject compositions can be used in a variety of other protective coating applications or as an adhesion promoting coating. These coatings are also useful to modify permeability and in photoresist applications.

The preferred composition of the photocurable materials described herein will vary dependent upon the end use and properties desired. One skilled in the art can readily determine preferred compositions either empirically or by reference to the teachings herein. An illustrative preferred composition for preparation of an adhesion promoter is depicted in Example 14. An illustrative preferred composition for preparation of a reverse osmosis membrane is depicted in Examples 3 through 7. An illustrative preferred composition for preparation of a fluorocarbon coating is presented in Examples 28 through 35. An illustrative preferred composition for preparation of a positive photoresist is depicted in Example 36. An illustrative preferred composition for preparation of a negative photoresist is depicted in Examples 1 and 2.

The following examples are presented to illustrate but not otherwise limit the subject invention. All parts and percentages are by weight unless otherwise indicated.

GENERAL PREPARATION OF POLYMERS

To a 500 milliliter (ml) roundbottom, 3-necked flask equipped with a condenser nitrogen purge, thermometer and means for heating were added the following monomers: 22.32 grams (g) hydroxy ethylmethacrylate (HEMA), 93.80 g of a 20 weight percent aqueous solution of vinylbenzyldimethyl sulfonium chloride (VBDMS), 6.41 g of methacrylic acid (MAA), 2.50 g of 2-sulfoethylmethacrylate (SEM). The VBDMS is prepared by reaction of commercially available vinylbenzyl chloride (a mixture of 60 percent meta and 40 percent para isomers) followed by reaction with dimethyl sulfide. The pH of the resulting mixture was tested and determined to be about 0.9. To this mixture was added 174 ml of a 0.5 normal aqueous sodium hydroxide solution to adjust the pH to 5.9. Seventy-six grams of tertiary butanol was added to the mixture and the mixture purged with nitrogen while stirring and heating to 50° C. Over a period of about one hour, 18 ml of water containing 0.143 g of tertiary butylhydroperoxide and 18 ml of water containing 0.75 g of Formopon (sodium formaldehyde hydrosulfite) were added to the reaction mixture in 1.5 ml increments every 5 minutes. The reaction mixture was then heated at 50° C. with stirring for 2½ hours.

To the resulting polymer solution was added an approximately equal volume of a styrene-divinylbenzene ion exchange resin in the bicarbonate form. The solution was filtered and then 0.22 percent on a solids basis of a Fluorad Surfactant FC135® (available from 3M, St. Paul, Minn.), was added. The resulting solution was filtered 4 times through Celite diatomaceous earth. The resulting solution contained approximately 3 percent solids and had a ratio of HEMA/VBDMS/MAA/SEM of about 44.6/37.5/12.8/5.0 by weight.

Another polymer was prepared in the manner generally similar to the foregoing polymer. To a reaction vessel was added 4.35 g MAA, 30 g methylmethacrylate (MMA), 51.8 g of a 20.56 percent aqueous solution of vinylbenzyltrimethylammonium chloride (VBTMA) and 25.6 g of a 19.52 percent solution of 9N10MA in water. The monomers MAA, VBTMA and 9N10MA were added to a mixture containing 50 g tertiary butanol and 50 g of water. The methyl methacrylate was introduced in a mixture containing 10 g of water and 60 g tertiary butanol. The reaction vessel was charged with 20 g water and 45 g tertiary butanol purged with nitrogen, heated to 50° C. with stirring. The mixture containing the methacrylic acid was added to the reaction vessel at the rate of 17.5 ml every 5 minutes and the methyl methacrylate was added to the reaction vessel at the rate of 10 ml every 5 minutes. Simultaneously, a solution containing 0.143 g tertiary butyl hydroperoxide in 18 ml of water and a solution of 0.075 g Formopon in 18 ml of water were introduced in 1.5 ml increments every five minutes to initiate the polymerization reaction. After the addition of all reactants and initiators was completed, the reaction mixture was heated at 50° C. for an additional 2½ hours with stirring. An additional 400 g of water was added to the reaction mixture and then the mixture was evaporated under reduced pressure to remove the tertiary butanol. The polymer solution was dialyzed with a filter having a 12,000 to 14,000 molecular weight cut-off for 3 days to separate the lower molecular weight materials. The higher molecular weight polymer in the solution was then subjected to reduced pressure to remove a major portion of the water present. The resulting solution weighed 206.2 g and had a solids content of 10.8 percent.

The resulting polymer contained a ratio of MAA/MMA/

VBDM/9N10MA of 8.7/60/21.3/10. The polymer solution was first stirred with a styrene-divinylbenzene strong base ion exchange resin in the hydroxide form and then the solution was separated. Finally, the polymer solution was separated and treated with a styrene divinylbenzene ("SDVB") strong base ion exchange resin in the bicarbonate form to yield a solution of a pH of approximately 8. The resulting solution was mixed with activated carbon and filtered through a bed of Celite diatomaceous earth 3 times. To the resulting solution was added 0.15 percent (on the basis of polymer solids present in the solution) of a fluorocarbon surfactant (Fluorad $FC_{135}$®, available from 3M, St. Paul, Minn.).

The formula for the naphthylmethylene onium salts described in Examples 15 and 17 is

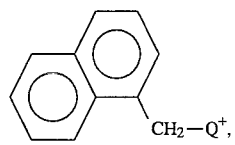

wherein $Q^+$ is the onium group.

EXAMPLE 1

A silicon wafer 2 inches in diameter was coated with an aqueous solution of a polymer derived from HEMA/VBDMS (in bicarbonate form)/MAA/SEM in a ratio of 44.6/37.5/12.8/5 by weight percent. The concentration of polymer in solution was 3.27 weight percent and the polymer contained 0.2 percent by weight on a solids basis of a fluorocarbon surfactant. The coating was applied by a Solitec 5100 Spincoater. The conditions used for coating were a run rpm of 1730, set rpm of 2,000, a ramp of 100 and a spin time of 2 minutes. The coating was then cured by exposure for about 10 minutes to a low pressure mercury lamp having about 90 percent its energy at a wave length of about 254 nm. The lamp was located about 2 inches from the sample and is sold by General Electric under the designation G8T5. The irradiation energy was approximately 2400 microwatts per square centimeter. A portion of the disk was shielded so it was not exposed. After exposure to the UV light, the coated disk was gently rinsed with tap water. The unexposed areas of the disk rapidly washed off the silicon wafer leaving a bare surface. The exposed areas were undisturbed by the washing.

It follows from this example that the polymer bearing sulfonium moieties and methacrylic acid nucleophilic groups cured readily when exposed to UV light.

EXAMPLE 2

A polymer solution of MAA/MMA/VBTMA (in the bicarbonate form)/9N10MA with the monomers present in the ratio of 8.7/60/21.3/10 by weight was prepared as described hereinbefore. The solution contained 5.7 percent solids in water by weight and 0.15 percent of a fluorocarbon surfactant by weight on a solids basis. The solution was applied to silicon wafers in a conventional spin coater. Five samples were prepared and then exposed to ultraviolet light having a significant energy output at a wavelength of 254 nm. The first sample was exposed for 40 seconds with an exposure mask covering a portion of the sample. The exposed portions of the coating did not wash off readily with water whereas the unexposed coating washed off readily.

Another coating was exposed to actinic radiation for about 20 seconds. Both exposed and unexposed areas of this coating washed off readily in water suggesting that the exposure to radiation was for too short of a period of time.

A third disk was heated for 15 seconds at 100° C. and then exposed to actinic radiation for 30 seconds. Part of this disk was covered by a line pattern. The resulting coating showed fairly good resolution, but small lines of one micron or less showed some tendency to wash off.

The fourth disk was heated for 15 seconds at 100° C. and then exposed to actinic radiation using a line mask for 40 seconds. The coating was washed with water gently. Exposed portions of the coating remained with resolution of as fine as 0.5 microns.

The fifth disk was heated for 1 minute and 15 seconds at 100° C. and then exposed to actinic radiation for 40 seconds using the line mask. This coating showed very good adhesion to the substrate and the unexposed areas readily were washed from the coating with water. A resolution of 0.75 micron was routinely achieved in the coating.

This example demonstrates that the subject polymer containing quaternary ammonium groups and carboxylic acid nucleophilic substituents can be readily photocured. It further demonstrates the improvement in photocuring that can be obtained by drying quaternary ammonium groups prior to curing them. Because the coating is water based it is easily applied. The photocured does not appear to be a chain-type mechanism and thus gives a very high degree of resolution. Because the photoresist film upon curing becomes water-insoluble, the development of the coating to remove the unexposed portions produces essentially no swelling. This contributes to the high degree of resolution obtained.

EXAMPLE 3

A vinyl addition polymer containing 60 weight percent HEMA, 30 weight percent vinyl benzyl pyridininium bicarbonate and 10 weight percent 9N10MA was prepared. A 2 weight percent solution of this polymer containing 0.2 weight percent of a fluorocarbon surfactant based on the weight of the solids was applied to a mixed cellulose ester microporous filter. This filter is sold by Millipore under the designation VSWP-204700. After 10 seconds the excess coating solution was removed by touching the uncoated side of the filter with absorbent paper. The coated filter was dried at room temperature for 3 hours. The filter was then placed under a General Electric G8T5 Ultraviolet Lamp at a distance of 4 inches for about 20 minutes.

The resulting cured coating was tested for salt rejection using a 2500 parts per million (ppm) aqueous sodium chloride solution at a 400 pounds per square inch (psi) pressure. The resulting composite membrane was determined to have a salt rejection of 81 percent at a flux of 2.88 gallons per square foot per day (gfd).

EXAMPLE 4

A vinyl addition polymer was prepared from 60 weight percent HEMA, 30 weight percent vinyl benzyl trimethyl ammonium bicarbonate and 10 weight percent 9N10MA. A 2 percent aqueous solution of the polymer containing 0.2 percent of a fluorocarbon surfactant based on the weight of the solids was applied to a microporous mixed cellulose ester filter. After about 10 seconds the excess coating was removed from the uncoated side of the filter using absorbent paper. The filter was then air dried for 12 hours.

Two coated filters were placed 4 inches from a UV lamp (General Electric G8T5) for 20 minutes. The resulting composite membranes were tested using an aqueous solution of 2500 parts per million sodium chloride at 400 psi with a flow rate between 55 and 65 ml per minute. The salt rejection and flux of the resulting coatings were 98.05 percent salt rejection at 0.68 gfd flux and 98.01 percent salt rejection at 0.74 gfd flux.

It is apparent from this example, that the subject photocured compositions can be used to prepare discriminating layers for reverse osmosis membranes.

EXAMPLE 5

The polymer was prepared from 60 weight percent HEMA, 30 weight percent VBDMS in the bicarbonate form and 10 weight percent 9N10MA. An aqueous solution containing 2 percent of the polymer and 0.2 percent on a solids basis of a fluorocarbon surfactant was applied to a microporous cellulose ester filter. After about 10 seconds the excess coating solution was removed from the opposite side of the filter by touching it with absorbent paper. The coated filter was then heated at 85° C. for 5 minutes.

The filter was exposed to UV radiation from a General Electric G8T5 lamp at a distance of 4 inches for about 20 minutes. A second coating of the same polymer solution but diluted to 1 percent solids was then applied and cured using actinic radiation.

The resulting composite membrane was tested using a 2500 ppm aqueous sodium chloride solution at a pressure of 400 psi with a feed flow rate of between 55 and 65 ml per minute. The resulting membrane had a salt rejection of 98.06 percent and a flux of 0.304 gfd.

EXAMPLE 6

A polymer similar to the one in Example 5 was prepared but this polymer had a methacrylate anion in the solution containing 1.6 percent by weight polymer. A filter was coated in a manner similar to Example 5 and dried under vacuum at 50° C. for 15 minutes. The coated filter was then exposed to UV radiation for 15 minutes using General Electric G8T5 lamp and the samples tested for salt rejection and flux in the manner described in Example 5. The resulting membrane had a salt rejection of 96.5 percent and a flux of 0.354 gfd using a 2500 ppm sodium chloride solution at 400 psi.

EXAMPLE 7

A polymer solution was prepared from 66 weight percent HEMA and 34 weight percent vinyl benzyl dimethyl sulfonium propionate. A microporous mixed cellulose ester filter was coated with a solution containing 0.71 percent of the polymer and then dried in air at room temperature. The coated filter was then exposed to UV radiation for 25 minutes as described in Example 5 and was recoated with the polymer solution and was cured again. The resulting composite membrane had a salt rejection of 98.94 percent and a flux of 1.02 gfd using a 2500 ppm NaCl solution at 400 psi.

EXAMPLE 8

The polymer described in Example 5, but in a chloride form, was dissolved in 80 percent tetrahydrofuran/20 percent water by volume. Nitrogen gas was sparged through this solution and then 3 ml of tri-n-butylphosphine was added to 3.4 g of this solution by introducing it directly into the solution below the surface of the same. The mixture was heated at 35° to 45° C. for 16 hours and then 55° to 65° C. for 2 to 3 hours. A colorless precipitate formed during heating. The volume of the solution was reduced by evaporation at reduced pressure and the remaining solution was dialyzed over night.

The solution was analyzed and it was determined that approximately ¼ of the sulfonium moieties present in the original polymer had been replaced by tributyl phosphonium chloride moieties. The copolymer solution was then diluted with isopropanol and 0.2 percent on a solids basis fluorocarbon surfactant was added. The viscous solution was applied to slides and exposed to ultraviolet radiation at a distance of about 2.5 inches from a General Electric G8T5 lamp for 20 minutes at approximately 30° C. The copolymer solution exposed to the UV radiation was no longer soluble in water while the portion of the solution protected from the radiation remained water dispersible.

An aqueous coating solution containing less than 1 percent by weight of the foregoing polymer and 0.2 percent (based on total solids) of the fluorocarbon surfactant was applied to a microporous cellulose ester filter. After about 10 seconds the excess coating was removed from the filter with absorbent tissue paper. The filter was then air-dried for 12 hours. Two coated filters were placed under a General Electric G8T5 UV lamp for 20 minutes at a distance of 3 inches. The resulting composite membranes were tested using a 2500 parts per million sodium chloride aqueous solution at 400 psi. The resulting membranes exhibited a salt rejection of 97.9 percent at 0.32 gfd flux and 98.64 percent at 0.308 gfd flux.

EXAMPLE 9

Polyvinyl benzyl chloride was mixed with 200 ml of tetrahydrofuran and nitrogen gas was sparged through the solution. To 8.5 g of the polyvinyl benzyl chloride was added 14 ml of tri-n-butyl phosphine and the solution was heated over night at 50° to 57° C. then 67° C. for 1 hour before cooling to room temperature. The polymer solidified during the reaction but the solid dissolved when water was added. Some solvent was then removed under reduced pressure and the resulting solution was dialyzed.

The resulting vinylbenzyl tri-n-butylphosphonium chloride polymer was then converted to the bicarbonate anion by treatment with an anion exchange resin. The pH of the resulting solution was 8.6 and the solids present was 1.1 percent. A microporous cellulose ester filter was first coated with a mixture of 93 weight percent of a polymer of 80 percent HEMA and 20 percent of a compound of the Formula I

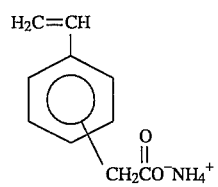

(I)

and 7 weight percent of a bisphenol A zwitterion of the following formula II

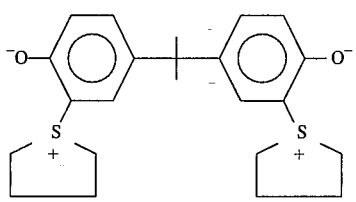

(II)

This base coat was applied as a 2 weight percent solid solution in water containing 0.2 percent of the fluorocarbon surfactant on a solids basis. The base coat was then cured for 15 minutes at 85° C. The filter was then coated once more with the zwitterion-containing solution but this time at a 0.5 percent solids level. Finally the coated filter was treated with the polyvinyl benzyl tri-n-butyphosphonium bicarbonate polymer.

The resulting coated filter was exposed to ultraviolet radiation from a General Electric G8T5 lamp at a distance of about 3 inches for 20 minutes. The resulting membrane had a salt rejection of 91.8 percent at 3.59 gfd flux using a 2500 part per million sodium chloride solution at 400 psi.

EXAMPLE 10

In a manner generally similar to Example 9, a phosphonium polymer was prepared from 40 mole percent vinyl benzyl chloride and 60 mole percent methyl methacrylate. This polymer was then reacted with tri-n-butylphosphine at ambient temperature for 0.5 hours and then the solution was heated at 50° C. for 14.4 hours. Fifty milliliters of water was then added to the solution and heating continued at 50° C. for another 33 hours. After cooling, most of the tetrahydrofuran was removed by evaporation at reduced pressure.

The resulting polymer was converted to the bicarbonate form using an anion exchange resin. An aqueous solution containing 1.46 percent by weight of the polymer was prepared. The resulting solution had a pH of 8.6. A large excess of methacrylic acid was added to reduce the pH to 3.8. The solution was then dialyzed for 24 hours. The resulting solution contained 0.37 percent solids. The resulting solution was coated on a glass microscope slide, dried and exposed to UV light from a lamp at a distance of about 3 inches for 20 minutes at ambient temperature. Curing of exposed portions was observed. The covered portion of the coating was washed off readily with water whereas the cured portion did not.

EXAMPLE 11

A 1:1 weight ratio mixture of polyacrylamide and a polymer of vinylbenzyldimethylsulfonium chloride was prepared. A 2 weight percent aqueous solution of this polymer containing 0.25 weight percent of a fluorocarbon surfactant based on the weight of the solids was applied to a glass slide. The coating was then dried at 80° C. for 10 minutes. The coated slide was exposed to UV light for 20 minutes. The portion of the coating exposed to UV light was water insensitive but the unexposed area was readily washed from the slide with water.

EXAMPLE 12

A homopolymer of vinylbenzyltrimethylammonium chloride was prepared. This polymer was then converted to the bicarbonate form by treatment with anion exchange resin. The ammonium polymer was used to prepare a 1:1 weight ratio mixture of polyacrylamide and the ammonium polymer in an aqueous solution containing 2 percent solids by weight and 0.2 percent of a fluorocarbon surfactant based on the weight solids. After drying at 90° C. for 10 minutes a portion of the film was exposed to UV light for 15 minutes. The coating exposed to the ultraviolet light was hydrophobic and water insensitive while the unexposed portion of the coating was readily washed from the coated slide with water.

EXAMPLE 13

A polymer like the one employed in Example 5 in the bicarbonate form was dissolved in water to produce a 9.2 weight percent solution. This solution had a pH of 8. Trifluoroacetic acid was added to the solution until the pH was reduced to 2.6. The solution was dialyzed over night and then concentrated to give 1.03 percent solids in water. The solution was used to coat glass slides. The coated slides were dried for 15 minutes at 40° C. under reduced pressure.

The coated slides were then irradiated at 24° C. for 15 minutes using a single General Electric G8T5 UV lamp. The resulting coatings were water insensitive.

No fluorocarbon surfactant was employed in this example and the resulting coatings did not wet readily when applied to glass slides. Similar coatings made in which 0.2 weight percent of a fluorocarbon surfactant on solids basis were added did wet uniformly when immersed in water.

A similar polymer to that in Example 13 was prepared with a propionate counterion. When this propionate salt of the polymer was used to prepare an aqueous solution in the manner described, such coating did not cure as readily when exposed to actinic radiation.

EXAMPLE 14

An aqueous solution of the polymer 2-hydroxyethylmethacrylate/vinylbenzyldimethylsulfonium chloride/methacrylic acid/9N10MA in a ratio of 85.1/3.1/10.9/0.9 was mixed with sufficient anion exchange resin (Dowex® SBR hydroxide form) to convert the polymer to the internal salt. This polymer was filtered through Celite diatomaceous earth. A 2 percent solution of the filtered solution was wiped on to samples of polystyrene, polymethylmethacrylate, polyester and polycarbonate. After drying at room temperature for two hours the samples were radiated 15,800 millijoules/cm$^2$ using an American Ultraviolet medium pressure high intensity lamp. Adhesion was evaluated by crosshatching with a sharp instrument, affixing transparent adhesive tape to the crosshatched coating, removing the tape by pulling and checking visually for coating loss. All the samples displayed little if any visible coating loss and excellent adhesion. This composition is suitable as a primer for modification of an interface of a polymer.

The process was repeated except the samples were thermally cured at 80° C. for one hour. All the resulting coatings had poor adhesion except the coating on a polyester substrate.

EXAMPLE 15

For the synthesis of 1-naphthylmethylene trimethylammonium chloride, 18.3 grams of 1-chloromethyl naphthalene, 55 g of trimethylamine in a 25 weight percent solution in water and 45 g of cyclohexane were mixed and stirred for about 0.25 hours at ambient temperature and then heated at 35° C. for about 16 hours. The solution was cooled to about 20° C. and the heptane-water layers were separated. The aqueous phase was extracted several times with diethyl ether to remove residual starting material and hydrolysis by-products. Most of the water was removed with a rotary evaporator. After washing with ether, the resultant colorless solid was placed in a vacuum oven at 35° C. for additional drying. NMR and IR confirmed the identity of the solid as the trimethylammonium salt (25.6 g isolated, including residual water).

EXAMPLE 16

Phenyl phosphinic acid (Aldrich, 0.601 g) and potassium tert-butoxide (Aldrich, $K^{\oplus} OC(CH_3)_3^{\ominus}$, 0.50 g) were mixed in methanol (about 25 ml) to give a clear solution. Seven grams of polyvinylbenzyl dimethyl sulfonium chloride (MW about 10,300, prepared from a 60/40 mixture of $-3$ and $-4$ isomers) was added dropwise to the phosphinate solution as a 50/50 v/v methanol/water mixture. No precipitate was observed. The solution was transferred to a dialysis bag with a 6,000–8,000 molecular weight cut-off. Water was added and the solution was dialyzed for $\geq 16$ hours. A rotary evaporator was used to concentrate the dilute solution (209 g, 0.79 percent solid). The polymer was confirmed to be poly(vinylbenzyl dimethyl sulfonium phenyl phosphinate.

EXAMPLE 17

1-Naphthylmethylene trimethyl ammonium chloride (about 2.6 g) was dissolved in about 20 ml methanol and added slowly to a stirred solution of polyacrylic acid, sodium salt (0.915 g, MW≅6,000 as purchased from Polyscience) in about 50/50 v/v methanol/water. A clear solution was maintained by adding methanol/water as necessary. This solution was dialyzed in $\geq 16$ hours in a bag with a 6000–8000 molecular weight cut off. The dialyzed solution was concentrated on a rotary evaporator before use. Infrared analysis confirmed the formation of the 1-naphthlylmethylene trimethyl ammonium salt of poly(acrylic acid).

EXAMPLE 18

Polyvinylbenzyl chloride (Aldrich, 11.3 g), trimethylamine (25 percent solution in water, 99.7 g) and cyclohexane (about 150 g) were stirred overnight (about 16 hours) at 35° C. This solution was heated to 50° C. for one hour before cooling. The solvent was removed under reduced pressure. the product formed a water-soluble off-white film. A strong base ion exchange resin, hydroxide form (about 58 g, dry) was treated with an excess of citric acid ($\geq 10$ g). After removing excess acid, poly(vinylbenzyl triethylammonium) chloride (4.7 g) in water (about 200 g) was passed through the resin column. A portion of the product was dialyzed in a manner similar to Example 17. Infrared analysis confirmed the formation of polyvinylbenzyl trimethylammonium)citrate.

EXAMPLES 19–24 GENERAL PROCEDURE

Precleaned glass microscope slides were used for cure line formation and solubility tests of photocured materials in irradiated and non-radiated zones. Aqueous solutions of polymeric onium salts were coated on slides and the slides were dried either by thermal heating at 75° to 85° C. for 5 to 10 minutes in runs C and D or by vacuum stripping at about 35° C. for 10 to 15 minutes at less than 1 torr in runs A and B. No additional surfactant was used, therefore the film thickness varied. Smooth surfaces were generally observed. Slides were placed in black paper pockets designed to shield half of each slide from irradiation. A Rayonet Photochemical Reactor was used for irradiating at different wavelengths. The slides were typically irradiated with eight lamps for 20 or 30 minutes. The time was approximately the same for each polymeric onium salt. The lamps, purchased from Rayonet, were designated as 185–254 nm, 254 nm, 300 nm, and 350 nm sources. The exact intensity of Rayonet sources varied with placement in the reactor, but average intensities are given: 254 nm (2.8–2.9 milliwatts/cm$^2$), 300 nm (2.9–3.0 mW/cm$^2$ using a meter calibrated at 310 nm), 350 nm (about 2.2 mW/cm$^2$ using a meter calibrated at 365 nm), and 185–254 (about 2.6–2.7 mW/cm$^2$ using a 254 nm meter).

After irradiation, the slides were treated with a series of solvents to determine differences in irradiated and non-radiated zones. Three solvents were generally used: water ($H_2O$), cyclohexane ($C_6H_{12}$), and methylene chloride ($CH_2Cl_2$). Other solvents included methanol ($CH_3OH$) and toluene ($C_6H_5CH_3$). Sequential use of the solvents permitted a quick evaluation of positive or negative photoresist potential and the stability and resolution of cure lines. Cure line formations took place at the irradiated, non-radiated edges or interfaces. When a line developed after treatment with the appropriate solvents, subsequent solvents treated the stability of the line or film that remained. In Tables I through VI, if the cure line persisted after solvent treatment and surface rubbing with a paper wipe, a positive ("+") designation was assigned. If the film broke during rubbing, this was indicated by a negative designation ("−"). If a complete coherent film is observed, this is indicated by "NC", representing "no change". Indeterminent results are indicated by "?". If results differed in repeated runs, this indicated by separating the results with a diagonal,"/". A typical negative photoresist (positive designation, "+") crosslinks in the irradiated zone, and the non-radiated zone washes away. Sequential treatment with solvents is indicated by ascending numbers for the solvents within a run. The optimum wavelength for curing the onium salts evaluated in Examples 19 through 24 based on UV absorption was 254 nanometers.

EXAMPLE 19

A homopolymer of vinylbenzyldimethylsulfonium chloride was prepared by reaction of poly(vinylbenzyl chloride) with dimethyl sulfide. The polymer was then converted to the bicarbonate form by treatment with an ion exchange resin. A 2.1 percent aqueous solution of the polymer was applied to the glass slide and cured after drying under reduced pressure (Runs A and B) or thermal curing (Runs C and D). The polymer was irradiated with different wavelengths for different samples. The cured samples were then solvent treated, rubbed manually and inspected. The results are reported in Table I.

TABLE I

| Wave Length | Runs | | | |
|---|---|---|---|---|
| | A* | B* | C** | D** |
| 254 nm | 1) H₂O (+) <br> 2) C₆H₁₂ (+) <br> 3) CH₂Cl₂ (+) | 1) C₆H₁₂ (−) <br> 2) H₂O (+) <br> 3) CH₂Cl₂ (+) | 1) H₂O (−/NC) <br> 2) C₆H₁₂ (−/NC) <br> 3) CH₂Cl₂ (−/NC) | 1) C₆H₁₂ (−/NC) <br> 2) H₂O (−/NC) <br> 3) CH₂Cl₂ (−/NC) |
| 185−(254) | 1) C₆H₁₂ (−) <br> 2) H₂O (+) <br> 3) CH₂Cl₂ (−) | 1) CH₂Cl₂ (+/?) <br> 2) C₆H₁₂ (−/?) <br> 3) H₂O (−) | 1) CH₂Cl₂ (−/NC) <br> 2) H₂O (−) <br> 3) C₆H₁₂ (−) | 1) C₆H₁₂ (−) <br> 2) H₂O (−) <br> 3) CH₂Cl₂ (−) |
| 300 | 1) CH₂Cl₂ (?) <br> 2) C₆H₁₂ (+/?) <br> 3) H₂O (−) | | 1) C₆H₁₂ (+) <br> 2) H₂O (−) <br> 3) CH₂Cl₂ (−) | |
| 300−350 | 1) C₆H₁₂ (−) <br> 2) H₂O (−) <br> 3) CH₃OH (−) | 1) CH₂Cl₂ (−) <br> 2) H₂O (−) | | |
| 350 | 1) C₆H₁₂ (−) <br> 2) H₂O (+/?) <br> 3) CH₂Cl₂ (−) | 1) H₂O (−) <br> 2) C₆H₁₂ (−) <br> 3) CH₂Cl₂ (−) | 1) H₂O <br> 2) C₆H₁₂ (+/?) <br> 3) CH₂Cl₂ (−) | |

*Dried at reduced pressure before irradiation
**Thermally cured before irradiation

EXAMPLE 20

A polymer prepared as described in Example 16 was coated on glass slides using a 1.54 percent aqueous solution. In the general manner described in Example 19, the coated slides were dried, irradiated, treated with solvents and rubbed. The results are tabulated in Table II.

TABLE II

| Wave Length | Runs | | | |
|---|---|---|---|---|
| | A* | B* | C** | D** |
| 254 nm | 1) H₂O (+) <br> 2) C₆H₁₂ (+) <br> 3) CH₂Cl₂ (+/?) | 1) C₆H₁₂ (+/?) <br> 2) H₂O (+) <br> 3) CH₂Cl₂ (+) | 1) H₂O (−NC) <br> 2) C₆H₁₂ −(NC) <br> 3) H₂O (NC) <br> 4) CH₂Cl₂ (NC) | 1) C₆H₁₂ (−) <br> 2) H₂O (+) <br> 3) CH₂Cl₂ (+) |
| 300 | 1) H₂O (−) <br> 2) C₆H₁₂ (−) <br> 3) CH₂Cl₂ (−) | 1) C₆H₁₂ (−) <br> 2) H₂O (−) <br> 3) CH₂Cl₂ (+/−) <br> 4) H₂O (+/?) | 1) H₂O (?) <br> 2) C₆H₁₂ (+) | |
| 185−254 | 1) H₂O (?) <br> 2) C₆H₁₂ (−) <br> 3) CH₂Cl₂ (−) | | 1) C₆H₁₂ (−) <br> 2) H₂O (−) <br> 3) CH₂Cl₂ (−) | |
| 300−350 | | | 1) C₆H₁₂ (−) <br> 2) H₂O (−) <br> 3) CH₂OH (−) <br> 4) CH₂Cl₂ (−/?) | |
| 350 | 1) H₂O (−) <br> 2) CH₂Cl₂ (−) | | 1) CH₂Cl₂ (−) <br> 2) H₂O (−) <br> 3) CH₂Cl₂ (−) | |

*Dried at reduced pressure beforeirradiation
**Thermally cured before irradiation

EXAMPLE 21

The procedure of Example 16 was used to prepare a 1:2 equivalent salt from benzyl phosphonate and polyvinylbenzyl dimethyl sulfoniom. Potassium tert-butoxide (0.467 g) and benzylphosphonic acid (0.350 g) were mixed in about 70 ml of 2:1 (volume ratio of methanol to water. The potassium benzylphosphonate solution was mixed with a stirred solution of polyvinyl benzyl sulfonium chloride (7.0 g of 12.6 percent solution) in water. The clear solution was transferred to a dialysis bag with a 6000−8000 molecular weight cut-off. After dialysis and concentration, analysis indicated a 1.01 percent solution of the 1:2 equivalent salt. A 1.01 percent aqueous solution of the polymer was coated on glass slides. In the general manner described in Example 19, the coated slides were dried, irradiated, treated with solvents and rubbed. The results are tabulated in Table III.

TABLE III

| Wave Length | Runs | | | |
|---|---|---|---|---|
| | A* | B* | C** | D** |
| 254 nm | 1) C₆H₁₂ (+) <br> 2) CH₂Cl₂ (+) | 1) C₆H₁₂ (+) | 1) CH₂Cl₂ (+) <br> 2) C₆H₁₂ (+) | 1) C₆H₁₂ (+) <br> 2) CH₂Cl₂ (+) |

TABLE III-continued

| Wave Length | Runs | | | |
|---|---|---|---|---|
| | A* | B* | C** | D** |
| 185–254 | 3) $H_2O$ (+/?)<br>1) $C_6H_{12}$ (−)<br>2) $H_2O$ (+/?)<br>3) $CH_2Cl_2$ (−) | | 3) $C_6H_5CH_3$ (+)<br>1) $H_2O$ (−)<br>2) $C_6H_{12}$ (−)<br>3) $CH_2Cl_2$ (−) | |
| 300 | 1) $C_6H_{12}$ (−)<br>2) $H_2O$ (−)<br>3) $CH_2Cl_2$ (−) | 1) $H_2O$ (−)<br>2) $C_6H_{12}$ (−/?) | 1) $C_6H_{12}$ (−)<br>2) $H_2O$ (−)<br>3) $CH_2Cl_2$ (−) | 1) $H_2O$ (−)<br>2) $C_6H_{12}$ (−)<br>3) $CH_2Cl_2$ (−) |
| 300–350 | 1) $C_6H_{12}$ (−)<br>2) $H_2O$ (−)<br>3) $CH_2Cl_2$ (−) | | 1) $H_2O$ (−)<br>2) $C_6H_{12}$ (−)<br>3) $CH_2OH$ (−)<br>4) $CH_2Cl_2$ (−) | |
| 350 | 1) $H_2O$ (−)<br>2) $C_6H_{12}$ (−) | 1) $C_6H_{12}$ (−)<br>2) $H_2O$ (−) | 1) $C_6H_{12}$ (−)<br>2) $H_2O$ (−)<br>3) $CH_2Cl_2$ (−) | 1) $H_2O$ (−)<br>2) $C_6H_{12}$ (−)<br>3) $CH_2Cl_2$ (−) |

*Dried at reduced pressure before irradiation
**Thermally cured before irradiation

EXAMPLE 22

A polymer prepared as described in Example 18 was coated on glass slides using a 2.4 percent aqueous solution after dialysis. In runs A and C of curing at the 254 nanometer wavelength the polymer was not dialyzed before being used in the coating. In all other runs it was dialyzed. In the general manner described in Example 19, the coated slides were dried, irradiated, treated with solvents and rubbed. The results are tabulated in Table IV.

TABLE IV

| Wave Length | Runs | | | |
|---|---|---|---|---|
| | A* | B* | C** | D** |
| 254 nm | 1) $H_2O$ (+/−)<br>2) $CH_2Cl_2$ (+/−/?)<br>3) $C_6H_{12}$ (−) | 1) $H_2O$ (+/−)<br>2) $C_6H_{12}$ (+/?)<br>3) $CH_2Cl_2$ (+/?) | 1) $C_6H_{12}$ (−/?)<br>2) $H_2O$ (+)<br>3) $CH_2Cl_2$ (−) | 1) $H_2O$ (+)<br>2) $C_6H_{12}$ (+)<br>3) $CH_2Cl_2$ (+) |
| 185–254 | 1) $H_2O$ (+/−)<br>2) $CH_2Cl_2$ (+)<br>3) $C_6H_{12}$ (−) | 1) $CH_2Cl_2$ (−)<br>2) $H_2O$ (+/−)<br>3) $C_6H_{12}$ (+/?) | 1) $CH_2Cl_2$ (−)<br>2) $C_6H_{12}$ (−)<br>3) $H_2O$ (+/?) | 1) $H_2O$ (+/−)<br>2) $C_6H_{12}$ (−)<br>3) $CH_2Cl_2$ (?/−) |
| 300 | 1) $C_6H_{12}$ (−)<br>2) $H_2O$ (−)<br>3) $CH_2Cl_2$ (−) | 1) $H_2O$ (−)<br>2) $CH_2Cl_2$ (−)<br>3) $C_6H_{12}$ (−) | 1) $C_6H_{12}$ (−)<br>2) $H_2O$ (−)<br>3) $CH_2Cl_2$ (−) | 1) $H_2O$ (−)<br>2) $C_6H_{12}$ (−)<br>3) $CH_2Cl_2$ (−) |
| 300–350 | 1) $C_6H_{12}$ (−)<br>2) $H_2O$ (−)<br>3) $CH_2Cl_2$ (−/+/?) | 1) $CH_2Cl_2$ (−)<br>2) $H_2O$ (−)<br>3) $C_6H_{12}$ (−) | 1) $C_6H_{12}$ (−)<br>2) $H_2O$ (−)<br>3) $CH_2Cl_2$ (−) | 1) $H_2O$ (−)<br>2) $C_6H_{12}$ (−)<br>3) $CH_2Cl_2$ (−) |

*Dried at reduced pressure before irradiation.
**Thermally cured before irradiation

EXAMPLE 23

A polymer prepared as described in Example 17 was coated on glass slides using a 5.4 percent aqueous solution. In the general manner described in Example 19, the coated slides were dried, irradiated, treated with solvents and rubbed. The results are tabulated in Table V.

TABLE V

| Wave Length | Runs | | | |
|---|---|---|---|---|
| | A* | B* | C** | D** |
| 254 nm | 1) $C_6H_{12}$ (+)<br>2) $H_2O$ (+) | 1) $H_2O$ (+/?/NC)<br>2) $CH_2Cl_2$ (+) | 1) $C_6H_{12}$ (NC/−)<br>2) $H_2O$ (NC/−)<br>3) $CH_2Cl_2$ (NC/−) | 1) $H_2O$ (+)<br>2) $C_6H_{12}$ (+) |
| 185–254 | 1) $C_6H_{12}$ (NC)<br>2) $CH_2Cl_2$ (?)<br>3) $H_2O$ (+/−) | | 1) $H_2O$ (+/?)<br>2) $C_6H_{12}$ (+)<br>3) $CH_2Cl_2$ (?) | 1) $C_6H_{12}$ (+)<br>2) $H_2O$ (−)<br>3) $CH_2Cl_2$ (?) |

TABLE V-continued

| Wave Length | Runs | | | |
|---|---|---|---|---|
| | A* | B* | C** | D** |
| 300 | 1) $C_6H_{12}$ (−/NC)<br>2) $H_2O$ (+/−)<br>3) $CH_2Cl_2$ | 1) $H_2O$ (+/?)<br>2) $CH_2Cl_2$ (−) | 1) $H_2O$ (+/?)<br>2) $C_6H_{12}$ (−)<br>3) $CH_2Cl_2$ (−) | 1) $C_6H_{12}$ (−)<br>2) $H_2O$ (+)<br>3) $CH_2Cl_2$ (+/?) |
| 300–350 | 1) $H_2O$ (+/?)<br>2) $CH_2Cl_2$ (+/?) | | 1) $H_2O$ (+/?)<br>2) $CH_3OH$ (−) | 1) $C_6H_{12}$ (+/?)<br>2) $H_2O$ (+/?) |
| 350 | 1) $C_6H_{12}$ (−)<br>2) $H_2O$ (−)<br>3) $CH_2Cl_2$ (−) | | 1) $H_2O$ (NC)<br>2) $C_6H_{12}$ (NC/−−)<br>3) $CH_2Cl_2$ (−) | 1) $H_2O$ (NC/?)<br>2) $C_6H_{12}$ (−)<br>3) $CH_2Cl_2$ (−) |

*Dried at reduced pressure before irradiation.
**Thermally cured before irradiation.

EXAMPLE 24

A 1-methylnaphthyl-1-dimethyl-sulfonium salt of polyacrylic acid was prepared in the general manner of Example 17 except a sulfide reactant was used instead of an amine. The polymer was coated on glass slides using a 1.54 percent aqueous solution. In the general manner described in Example 19, the coated slides were dried, irradiated, treated with solvents and rubbed. The results are tabulated in Table VI.

EXAMPLE 25

A vinylbenzyl chloride homopolymer is reacted in an aqueous solution with (3-hydroxyphenyl)dimethyl amine in a methyl ethyl ketone solution at about 50° C. for about 65 hours to form a polymer containing recurring units of the following formula:

TABLE VI

| Wave Length | Runs | | | |
|---|---|---|---|---|
| | A* | B* | C** | D** |
| 254 nm | 1) $C_6H_{12}$ (+/?)<br>2) $H_2O$ (+)<br>3) $CH_2Cl_2$ (+) | 1) $CH_2Cl_2$ (?)<br>2) $C_6H_{12}$ (+)<br>3) $H_2O$ (+) | 1) $H_2O$ (−)<br>2) $C_6H_{12}$ (−)<br>3) $CH_2Cl_2$ (+) | 1) $H_2O$ (?)<br>2) $C_6H_{12}$ (NC)<br>3) $CH_2Cl_2$ (NC) |
| 185–254 | 1) $C_6H_{12}$ (−/?)<br>2) $H_2O$ (−/?)<br>3) $CH_2Cl_2$ (+/?) | | 1) $H_2O$ (−)<br>2) $C_6H_{12}$ (−/?)<br>3) $CH_2Cl_2$ (−) | 1) $CH_2Cl_2$ (+/?)<br>2) $C_6H_{12}$ (+/?)<br>3) $H_2O$ (−) |
| 300 | 1) $C_6H_{12}$ (−/NC)<br>2) $H_2O$ (+/−)<br>3) $CH_2Cl_2$ (−) | 1) $H_2O$ (+/−)<br>2) $CH_2Cl_2$ (−) | 1) $H_2O$ (+/−)<br>2) $C_6H_{12}$ (−)<br>3) $CH_2Cl_2$ (−) | 1) $C_6H_{12}$ (−)<br>2) $H_2O$ (+)<br>3) $CH_2Cl_2$ (+/?) |
| 300–350 | 1) $H_2O$ (+/?)<br>2) $CH_2Cl_2$ (+/?) | | 1) $H_2O$ (+/?)<br>2) $CH_3OH$ (−) | 1) $C_6H_{12}$ (+/?)<br>2) $H_2O$ (+/?) |
| 350 | 1) $C_6H_{12}$ (−)<br>2) $H_2O$ (−)<br>3) $CH_2Cl_2$ (−) | | 1) $H_2O$ (NC)<br>2) $C_6H_{12}$ (NC/?)<br>3) $CH_2Cl_2$ (NC/?) | 1) $H_2O$ (NC/?)<br>2) $C_6H_{12}$ (−)<br>3) $C_6H_{12}$ (−) |

*Dried at reduced pressure before irradiation.
**Thermally cured before irradiation.

SUMMARY OF RESULTS FOR EXAMPLES 19–24

Counterions are believed to determine which products form. Model compounds demonstrated that carboxylate counterions give a higher percentage of ester linkages whereas bicarbonate moieties give appreciable amounts of bibenzyl.

The relative lipophilicity of the counterions were also important determinants in positive or negative photoresist development. Methylnaphthyl moieties, in Examples 23 and 24, were effective in imparting both positive and negative resist activity. The irradiated methylnaphthyl films had enhanced solubility in organic solvents and the nonradiated salts were soluble in water. Multidentate counterions increased the potential for crosslinking without a substantial reduction in water solubility. Examples 21 and 22 illustrate multidentate counterions with similar UV absorption profiles. Polymethylnaphthyl salts utilized 300 nm incident radiation more efficiently than the polybenzyl salts.

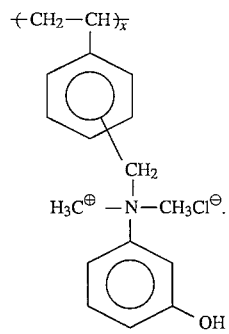

The resulting polymer was only slightly soluble in 30 percent isopropanol/70 percent water. A solution containing 0.22 percent solids was converted with a strong base ion exchange resin in the hydroxide form to a polymer containing zwitterion moieties of the formula:

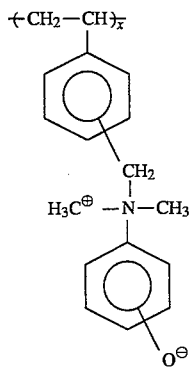

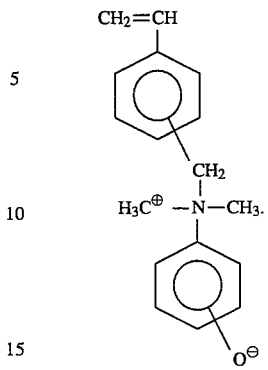

This polymer solution was used to test the concept of UV irradiation crosslinking with cure line formation. The pH of the dilute homopolymer was 8.7. A small amount of a fluorocarbon surfactant (0.2 percent on a solids basis of FC135 surfactant available from 3M, St. Paul, Minn.) was added to the polymer solution. The resulting solution was coated on glass slides. A simple medicine dropper was used to place the solution on the slides, and drying was done either at 80° to 85° C. thermally or in a vacuum at 45° to 50° C. The drying times were 5 to 10 minutes thermally or approximately 10 minutes using vacuum. The slides were partially covered with black paper sleeves during irradiation. The thin film of the solution was irradiated using a low pressure, single GE lamp with a major output at 254 nm. The irradiated slides were "developed" using water with subsequent rubbing of the surface. The vacuum dried films gave clear cure lines after approximately 15 to 20 minutes irradiation, which persisted after rubbing. Cure lines were observed after thermal drying for 5 minutes and irradiating for 15 and 20 minutes. Ten minutes of irradiation did not give a clear cure line and 30 minutes of irradiation gave a solid cure (no line and curing in the the covered region).

EXAMPLE 26

Ten grams of a vinylbenzyl chloride monomer (60/40 mixture of meta/para isomers) is reacted with 9.2 g of 97 percent (3-hydroxyphenyl)dimethyl amine in 120 g of methylethyl ketone solution at 44° C. for 45 hours to form a solution containing the monomer

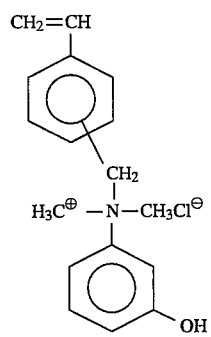

The monomer was converted with a strong base ion exchange resin to a zwitterion of the formula:

A solution of the "monomer" was prepared on the assumption that the solubility in water and alcohol would be greater than the polymer. It was not determined whether the isolated solution contained monomer exclusively, but the solubility was clearly much higher for the monomer. A 1.8 percent, 30 percent isopropyl alcohol-water solution of the monomer was used to coat glass slides. The procedure was essentially the same as outlined in Example 23. The fluorocarbon surfactant concentration was about 0.2 percent based on the solid content in solution. Cure lines were obtained from both thermal and vacuum drying. The thermally dried samples gave the better cure lines. The vacuum dried samples gave good cure lines but the rub resistance tended to be lower. This is consistent with a lower molecular weight for vacuum drying. The pH of the solution prior to curing was greater than 8.8.

EXAMPLES 27–36

A fluorinated alcohol, ketone or carboxylic acid was reacted with a vinylbenzyl dimethylsulfonium (VBDMS) monomer or polymer. The anion was hydroxide or chloride. In some embodiments a terpolymer of VBDMS, HEMA and 9N10MA was employed. More detailed preparations for each example follows hereafter for Examples 27–36. The compositions prepared and cured are tabulated in Table VII.

EXAMPLE 27

A 0.51 g benzyl dimethyl sulfonium hydroxide solution was prepared from the corresponding chloride solution using a strong base ion exchange resin in the hydroxide form. Approximately 0.6 g of 1,1,1,3,3,3-hexafluoro-2-propanol, $(CF_3)_2CHOH$, was added. The solution was opaque. The sample was sealed in a quartz tuber frozen with a dry ice bath, and evacuated to remove air. The thawed sample was placed in a Rayonet photochemical reactor, and irradiated for about 2.3 hours at 254 nm (8 lamps of about 2800µ watts). The irradiated solution was extracted with chloroform and the volume reduced before analysis by mass spectrometry. A characteristic spectrum with parent peak m/e=258.2 was observed for the benzyl hexafluoro isopropyl ether. The hexafluoro ether eluted from the GC-MS with a relative abundance of 100 percent.

EXAMPLE 28

A sulfonium terpolymer of $VBS^+$/HEMA/9N10MA (30/60/10) in the chloride form (4.33 g, 9.2 weight percent in water), was passed through an excess of strong base ion exchange resin in the bicarbonate form. The resultant pH was about 8.0. Trifluoroacetic acid was added until pH was about 2.6. The solution was dialyzed overnight, then concentrated to give 1.03 percent solid in water. The unfiltered solution was used to coat precleaned glass plates. The plates were dried for about 15 minutes at about 40° C. water under reduced pressure. The plates were irradiated at 24° C. for 15 minutes using a single GE 254 nM lamp (about 2800 µW/cm$^2$). The evolution of a sulfur-containing compound was noted. Water-resistant films were formed on the irradiated plates, but untreated standards gave clear signs of wetting. The experiment was repeated with added fluorocarbon surfactant (FC 134 surfactant available from 3M, ST. Paul, Minn.) at about 0.2 weight percent of copolymer. This time both vacuum dried (40° C., 15 minutes) and air dried plates (about 65° C., 20 minutes) gave almost uniform wetting. The experiment was repeated again with and without fluorocarbon surfactant. The plates without surfactant did not wet when immersed in water, but uniform wetting was observed for the plate incorporating the 0.2 weight percent surfactant. These data support UV curing and improved coating properties when fluoroacetate moieties are used in the absence of added surfactant.

EXAMPLE 29

The perfluoropropionate adduct of the 30/60/10 copolymer was prepared using the procedure of Example 28. A coating mixture was prepared using 6.0 g (1.18 percent solid) aqueous solution of 30/60/10-perfluoropropionate copolymer, 6.0 g of water and about 15 g of 1 percent FC 134 surfactant in water. Vacuum (40° C., 10–15 minutes) and air dried plates were prepared using the coating mixture. The plates were half covered to provide simple controls. The same UV lamp as in Example 28 was used for 20 minutes. Curing of the exposed regions was observed.

EXAMPLE 30

Excess perfluoropropionic acid, $CF_3CF_2C(O)OH$, 3 g, was reacted with the bicarbonate form of polyvinylbenzylsulfonium polymer (about 4.78 meq) using the procedure of Example 28. The dialyzed, viscous, clear solution gave 1.2 percent solid in water. Using half covered plates for controls (20 minute irradiation, GE G8T5 lamp, about 30° C.), good to very good cures were observed for uncovered irradiated sample with no curing for covered samples. The degree of curing was more dependent on the thickness of the film than the method of dry coatings (air or vacuum).

EXAMPLE 31

Strong base ion exchange in the hydroxide form (about 40 meq) was treated with 29.3 g of polyvinylbenzyldimethylsulfonium chloride solution (3.4 percent solid, about 4.8 meq) to convert the polymer to the hydroxide form. Approximately 2.1 g of pentafluorophenol was added to the solution. A gummy precipitate formed. The solution was dialyzed to remove excess phenol. After dialysis, coated glass plates were prepared using air drying (60° C., 10–15 minutes) was vacuum drying (45° C., about 12 minutes). AGE G8T5 lamp was used for irradiation. All plates or slides were half covered. Excellent cures were obtained for the uncovered areas and no cures were observed for covered areas.

EXAMPLE 32

Polyvinylbenzyl dimethylsulfonium hydroxide solution was formed from a solution of the corresponding chloride salt. Approximately 56 g of strong base resin in the hydroxide form was used with approximately 22.2 g of the 12 percent poly(VBDMS) solution (in the chloride form), and 86.1 g of solution was collected from the column. An analysis of the solution gave 2.68 percent of solid polymer. A mixture of 9.4 g of polymer and 0.504 g of hexafluoroacetylacetone was prepared. One percent FC134 fluorocarbon surfactant was added to an aliquot (5 g) to give a 0.2 percent by weight solution of the surfactant on a solids basis. An equal volume of of water (5 g) was added to the aliquot solution to dissolve any solid that had formed from the polymer-alkoxide reaction. Two glass slides were coated with the polymer solution and vacuum dried for 11–12 minutes at 40° to 45° C. The GE G8T5 lamp was used at 254 nm for 20 minutes at 22° C. Half of the plates were covered. Excellent cure lines were formed. The plates were left in water overnight and the coherent films were still intact the next day.

EXAMPLE 33

The procedure was similar to Example 28. The mixture of poly(VBDMS$^+$Cl$^-$) and $CHF_2CF_2CFHOH$ was filtered before use. After 10 minutes of Hanovia lamp irradiation of coated glass plates, a slightly cloudy but apparently cured film was observed. An additional 13 minutes of irradiation did not change the results. Thickness or uniformity of the film was not determined. When the test was repeated using vacuum drying, a cured but non-uniform film was observed.

EXAMPLE 34

This procedure reacted of polyvinylbenzyl dimethyl sulfonium chloride with a fluorinated alcohol. Solid polymer was prepared from an aqueous solution by freeze drying. Solid polymer (0.057 g) was dissolved in 1H,1H,5H-octafluoro-1-pentanol, $HCF_2(CF_2)_3CH_2OH$. A clear solution resulted. Slides (glass plates) were prepared with good initial spreading without additional surfactant. With a minimum of heat treatment, the slides were placed under a medium pressure, high intensity mercury vapor Hanovia lamp (about 254 nm, estimated, ≦35° C.) for 10 minutes. Slightly cloudy but apparently cured film resulted. Extending the irradiation time another 13 minutes did not change the results. The final films were not uniform. More films were prepared using vacuum drying at 40° C. for 15 minutes. Half covered slides were irradiated for about 20 minutes. There was slight birefrigency but curing was accompanied by generation of odor and a definite cure line between covered and uncovered polymer (covering prevents surface irradiation).

EXAMPLE 35

PVBDMS$^+$Cl$^-$ and 2,2,2-trifluoroethanol, $CF_3CH_2OH$. The procedure was the same as Example 28. The initial films were apparently too thick because incomplete curing and birefrigency (color separation) were observed after 10 minutes of irradiation with the Hanovia lamp. Extending the irradiation time another 13 minutes resulted in a very strong odor (more curing) but rubbing with water gave a spectrum of color. The conclusion was that the film was too thick and non-uniform. Using vacuum drying (15 minutes, about 40° C.) and half-covered slides (irradiation, about 20 minutes) resulted in a cure line but incomplete curing.

TABLE VII

| Example | VBDMS+ | HEMA | 9N10MA | Anion | Fluorinated Reagents |
|---------|--------|------|--------|-------|----------------------|
| 27 | 100 | 0 | 0 | OH— | $HOCH(CF_3)_2$ |
| 28 | 30 | 60 | 10 | $HCO_3$— | HOC(=O)CF$_3$ |
| 29 | 30 | 60 | 10 | OH— | HOC(=O)CF$_2$CF$_3$ |
| 30 | 100 | 0 | 0 | OH— | HOC(=O)CF$_2$CF$_3$ |
| 31 | 100 | 0 | 0 | OH— | pentafluorophenol (HO–C$_6$F$_5$) |
| 32 | 100 | 0 | 0 | OH— | $CF_3C(O)CH_2C(O)CF_3$ |
| 33 | 100 | 0 | 0 | Cl— | $HOCHF(CF_2)_2H$ |
| 34 | 100 | 0 | 0 | Cl— | $HOCH_2(CF_2)_3CF_2H$ |
| 35 | 100 | 0 | 0 | Cl— | $HOCH_2CF_3$ |

EXAMPLE 36

An ionically-coupled polymer was prepared having the following recurring units

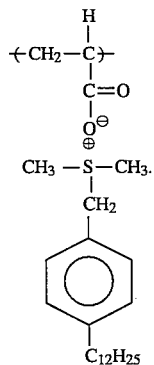

This polymer was dissolved in a mixed solvent 70 percent ethanol/30 percent tertiary butanol to yield a 3 percent solution. The 3 percent solution was wiped on two glass microscope slides and dried at 25° C. for 2 hours. The resulting films were soft. A portion of the soft films were covered with aluminum foil. The slides were then exposed for 4.5 minutes to a medium-pressure, high intensity, mercury vapor Hanovia lamp at 3000–5000 microwatts/cm$^2$ in an immersion well apparatus (Cat #6515 firm Ace Glass Incorporated, Vineland, N.J. 08360).

The coated slides were "developed" by washing with heptane to yield a sharp contrast between the exposed side which was heptane soluble and the unexposed polymer film which was not removed during the heptane wash. This illustrates how a positive photoresist can be prepared. One slide was reexposed to the UV lamp for 10 minutes to harden the film remaining. The other slide was heated at 120° C. to harden the remaining film. Both UV and thermal appeared to further cure the films.

EXAMPLES 37–45

An epoxy resin based on a diglycidyl ether of bisphenol A was reacted with a precursor of an onium compound. The equivalent weight of the epoxy resin was 186±4, 250 or 525±5, with all resins being commercially available from The Dow Chemical Company.

The epoxy onium salt resins described herein were prepared using similar equipment and techniques. The epoxy resin was dissolved or dispersed in a suitable solvent and a dialkyl sulfide, trialkyl phosphine or trialkyl amine was added in the presence of a weak organic acid, usually acetic acid. Water can be added to increase the total solubility as the onium salt is formed. Two illustrative examples of these preparations follow.

PREPARATION OF EXAMPLE 40 FOR RESIN EQUIVALENT WEIGHT 250

The reagents were: DER™ 337 epoxy resin available from The Dow Chemical Company (equivalent weight, approximately 250), 13.5 g; imidazole, 4.0; glacial acetic acid, 3.5 ml, and approximately 175 ml of tetrahydrofuran as solvent. The reagents were placed in a 500 ml three-necked flask equipped with a mechanical stirrer, a reflux condenser, and a N$_2$ gas bubbler. The solution was stirred at 50° C. for about 66 hours (over the week-end). The solution was cooled and transferred to a rotary evaporator to remove the solvent. A viscous solution resulted which was soluble in alcohol, had low solubility in watery but was partially soluble in isopropanol-water mixtures. Drying was continued under partial vacuum. Analysis of the dried solid gave 65.4 percent carbon, 7.00 percent hydrogen and 7.32 percent nitrogen. This product could be used for further modification such as counterion exchange. The normal solution for cure line testing was 2.0 percent solids in an alcohol-water mixture.

PREPARATION OF EXAMPLE 44 FOR RESIN EQUIVALENT WEIGHT 186

The reagents were: 11.4 g of DER™331 epoxy resin, available from The Dow Chemical Company (equivalent weight 186), approximately 5 ml of acetic acid, and approximately 25 ml of tri(n-butyl)phosphine. The solvent was a mixture of 200 ml tetrahydrofuran and 50 ml of water. The reagents were placed in a 500 ml three-necked flask equipped with a mechanical stirrer, a reflux condenser, and a $N_2$ gas bubbler. The tri(n-butyl)phosphine was added to the mixture by a syringe beneath the liquid surface. A stream of $N_2$ gas was used throughout the reaction. The mixture was stirred at ambient temperature for about 72 hours then heated to reflux temperature for two days. The solution was cooled and the solvent removed using $N_2$ evaporation and a rotary evaporator. The residual liquid was filtered through Celite diatomaceous earth, using an acetone-methanol mixture as the solvent. After removing most of the solvent again, the condensed sample was washed with diethyl ether several times before final drying.

A strong base ion exchange resin column was prepared with trifluoracetate as the counterion by treating the resin in the OH- form with an excess of trifluoroacetic acid. Excess acid was removed from the column before treating the trifuoroacetate column with the tri(butyl)phosphonium acetate resin. A large equivalent excess of Dowex ion exchange resin was used with a 3.0 g sample of the phosphonium acetate salt. A white precipitate formed as the acetate salt was added to the column, but the precipitate washed through the column using methanol-water. The solution was concentrated before use. The normal solution for cure line testing was 2.0 percent solids in an alcohol-water mixture. A fluorocarbon surfactant (FC134) surfactant was added to make a 0.79 percent surfactant solution based on the resin weight.

A similar procedure was used to prepare the equivalent epoxy phosphonium resin with fluoride as the counterion. The surfactant solution was 0.35 percent for the fluoride solution.

GENERAL ULTRAVIOLET CURING PROCEDURE

The basic procedure for cure line testing was used as given in previous examples using a GE G8T5 lamp. Thin film of epoxy resin based onium salt was coated on clean glass slides using a paper-wipe technique. After drying, half-covered slides were irradiated for 20 minutes near ambient temperature (about 30° C.). Cure lines were observed after washing with water and rubbing. Thicker coatings also gave cure lines but the coatings were less uniform and the films appeared somewhat sticky after prolonged rubbing. In general, weaker nucleophiles, such as the fluoride, trifluoroacetate, and methanesulfonate appeared to give better cure lines for these onium salts than stronger nucleophiles. This differs from the earlier observations for the benzyl derivatives. Results for epoxy onium salts are given in Table VIII. Although cure lines were observed as indicated, post-curing by additional irradiation or a thermal method would be advantageous after developing.

TABLE VIII

| Example | Onium | Counter -ion | Resin Equivalent Weight | Cure |
| --- | --- | --- | --- | --- |
| 37 | $-S(CH_3)_2^{\oplus}$ | $HCO_3^-$ | 186 | Yes |
| 38 | $-S(CH_3)_2^{\oplus}$ | $HCO_3^-$ | 525 | Yes |
| 39 | $-\underset{\underset{CH_2CH_2OH}{\mid}}{\overset{\overset{(CH_3)_2}{\mid}}{N^{\oplus}}}$ | $HCO_3^-$ | 525 | Yes |
| 40 | imidazole N-H | $CH_3C(=O)O^-$ | 186 / 250 | Yes / Yes |
| 41 | $-\overset{+}{P}(C_4H_9)_3$ | $HCO_3^-$ | 186 | No |
| 42 | $-\overset{+}{P}(C_4H_9)_3$ | $CH_3C(=O)O^-$ | 186 | Yes |
| 43 | $-\overset{+}{P}(C_4H_9)_3$ | $CH_3C(=O)O^-$ | 250 | Yes |
| 44 | $-\overset{+}{P}(C_4H_9)_3$ | $CH_3C(=O)O^-$ | 186 | Yes |
| 45 | $-\overset{+}{P}(C_4H_9)_3$ | $CH_3SO_3^-$ | 250 | Yes |
| 46 | $-\overset{+}{(C_4H_9)_3}$ | $F^-$ | 186 | Yes |

EXAMPLE 47

A 5 percent aqueous solution of a vinyl addition polymer containing a one to one ratio of moieties derived from the monomers vinylbenzyl sulfonium bicarbonate and $CH_2=CH-C(O)OCH_2CH_2N(C_4H_9)SO_2R_f$, where $R_f$ is a mixture of $C_8F_{17}$ and $C_7F_{15}$ was applied to a microscope slide by drawing with a glass rod. The resulting coating was dried under a stream of nitrogen for two hours and exposed to UV light for 15 minutes. The coating must be essentially free of water to avoid the water reacting as a nucleophile instead of the bicarbonate. The critical surface tension of wetting (measured using a homologous series of n-alkanes as described by W. A. Zisman, Adv. Chem. Ser., No. 43 (1964)) was 13.2 dynes. The vinyl addition polymer may be prepared as described in U.S. patent application Ser. No. 402,176, filed Sep. 1, 1989.

EXAMPLE 48

A 14.5 percent aqueous solution of the polymer having recurring units of the formula

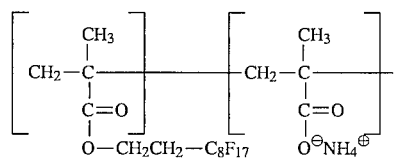

in a 80/20 weight ratio was mixed with a solution of

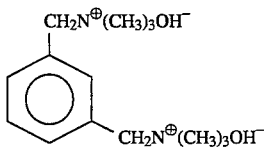

prepared via ion exchange of the corresponding chloride salt until the pH was 9. The resulting solution was wiped on a microscope slide, dried at 25° C. for one hour and heated in an oven at 85° C. for 20 min. Part of the coating was covered with a microscope slide and then exposed to UV for 20 min. The resultive exposed coating did not wet with hexane whereas the covered areas wet readily. When washed, the unexposed portion washed off leaving a sharp line between the hydrophobic exposed section and the bare glass.

What is claimed is:

1. A composite reverse osmosis membrane wherein at least one layer of the membrane is a photocured coating prepared by the method comprising:
   (a) applying to a substrate (i) a first compound bearing an average of more than one photolabile onium group bonded to a chromophore group via a linking group, wherein the onium is substantially free of unsaturated substituents which are photo-reactive and has a compatible anion, and (ii) a second compound bearing at least one photo-reactive nucleophile, so as to form a coating of an intimate mixture of (i) and (ii) on the substrate,
   (b) exposing the coating of the first compound and second compound to electromagnetic radiation effective to react a plurality of the photolabile onium groups of the first compound with a plurality of photo-reactive nucleophile groups of the second compound with extinction of the cationic charge on the onium groups reacted.

2. The membranes as described in claim 1 wherein the first and second compounds are polymers having the same composition.

3. The membranes as described in claim 1 wherein the first and second compounds are water-soluble.

4. The membranes as described in claim 1 wherein the product of the reaction of the first and second compounds is water-insoluble.

5. The membranes as described in claim 1 wherein the onium is selected from the group consisting of sulfonium quaternary ammonium, phosphonium, pyridinium, thiazolinium, imidazolinium, sulfoxonium, and azetidinium.

6. The membranes as described in claim 5 wherein the chromophore group is a phenyl or naphthyl group and the linking group is methylene, ethylidene or

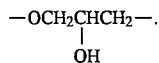

7. The membranes as described in claim 6 wherein the onium group is dialkyl sulfonium, trialkyl phosphonium or trialkyl ammonium wherein each alkyl has from 1 to 4 carbon atoms or where two alkyl groups may be joined to form a 4 or 5 carbon atom alkylene which forms a ring with the onium.

8. The membranes as described in claim 7 wherein the electromagnetic radiation has sufficient energy at wavelengths in the range from about 200 to about 310 nm to promote reaction of a plurality of onium groups with a plurality of nucleophile groups.

9. The membranes as described in claim 2 wherein the first and second compounds are derived from vinyl addition polymers of from about 1 to about 99 mole percent vinylbenzyl halide, from about 1 to about 50 mole percent of a vinyl group bearing photo-reactive nucleophile moieties or precursors of these nucleophile moieties and from about 0 to about 98 mole percent of compatible vinyl monomers and a plurality of the benzyl halide groups have been reacted with precursors of photolabile onium groups.

10. The membranes as described in claim 9 wherein the photo-reactive nucleophile group is carboxylate, alkoxide or phenoxide.

11. The membranes as described in claim 10 wherein the photolabile onium group is dialkyl sulfonium, trialkyl phosphonium or trialkyl ammonium wherein each alkyl has from 1 to 14 carbon atoms or where two alkyl groups may be joined to for a 4 or 6 carbon atom alkylene which forms a ring with the onium.

* * * * *